United States Patent [19]
Hori et al.

[11] Patent Number: 5,707,487
[45] Date of Patent: Jan. 13, 1998

[54] METHOD OF MANUFACTURING SEMICONDUCTOR DEVICE

[75] Inventors: Masaru Hori; Hiroyuki Yano, both of Yokohama; Keiji Horioka, Kawasaki; Haruo Okano, Tokyo, all of Japan

[73] Assignee: Kabushiki Kaisha Toshiba, Kawasaki, Japan

[21] Appl. No.: 332,504

[22] Filed: Oct. 31, 1994

Related U.S. Application Data

[63] Continuation of Ser. No. 823,813, Jan. 22, 1992, abandoned.

[30] Foreign Application Priority Data

| Jan. 22, 1991 | [JP] | Japan | 3-21569 |
| Jul. 30, 1991 | [JP] | Japan | 3-211302 |
| Jan. 10, 1992 | [JP] | Japan | 4-3372 |

[51] Int. Cl.$^6$ .................................................. H01L 21/302
[52] U.S. Cl. .................... 156/659.11; 156/656.1; 156/657; 156/643.1; 156/662.1
[58] Field of Search ................ 156/643.1, 646.1, 156/662.1, 659.11, 656.1, 657.1; 437/225

[56] References Cited

U.S. PATENT DOCUMENTS

| 4,496,448 | 1/1985 | King et al. | 204/192 E |
| 4,592,800 | 6/1986 | Landau et al. | 4/643 |
| 4,620,898 | 11/1986 | Banks et al. | 156/643 |
| 4,704,342 | 11/1987 | Lehrer | 430/5 |
| 4,820,611 | 4/1989 | Arnold et al. | 430/271 |
| 4,904,338 | 2/1990 | Kozicki | 156/628 |
| 4,956,043 | 9/1990 | Kanetomo et al. | 156/345 |
| 4,975,144 | 12/1990 | Yamazaki et al. | 156/643 |
| 5,022,959 | 6/1991 | Itoh et al. | 156/643 |
| 5,102,498 | 4/1992 | Itoh et al. | 156/659.1 |
| 5,147,500 | 9/1992 | Tachi et al. | 156/643.1 |
| 5,240,554 | 8/1993 | Hori et al. | 156/643 |

FOREIGN PATENT DOCUMENTS

| 0 285 129 | 10/1988 | European Pat. Off. |
| 3 428 565 | 3/1985 | Germany |
| 235 010 | 4/1986 | Germany |
| 38 21 614 | 12/1989 | Germany |
| 58-94078 | 6/1983 | Japan |
| 58-212136 | 12/1983 | Japan |
| 60-117723 | 6/1985 | Japan |
| 60-119731 | 6/1985 | Japan |

(List continued on next page.)

OTHER PUBLICATIONS

"Microwave Plasma Etching of Silicon and Silica In Halogen Mixtures", J. Vac. Sci. Tech., B (1989), 7(1); pp. 59–67; Pelletien et al.

1990 Dry Process Symposium; pp. 105–109; 1990, T. Ohiwa, et al., "$SiO_2$ Tapered Etching Employing Magnetron Discharge".

J. Electrochem. Soc.; vol. 136, No. 4; Apr. 1989; pp. 1181–1185; T.R. Pampalone, et al.; "Improved Photoresist Patterning Over Reflective Topographies Using Titanium Oxynitride Antireflection Coatings".

J. Appl. Phys.; vol. 60, No. 3; Mar. 1979; pp. 1212–1214; H.A.M. Van Den Berg, et al.; "Antireflection Coatings on Metal Layers for Photolithographic Purposes".

(List continued on next page.)

Primary Examiner—R. Bruce Breneman
Assistant Examiner—George Goudreau
Attorney, Agent, or Firm—Oblon, Spivak, McClelland, Maier & Neustadt, P.C.

[57] ABSTRACT

According to this invention, a method of manufacturing a semiconductor device includes the steps of forming a carbon film on a surface of a substrate, forming a mask pattern on the carbon film, etching the carbon film along the mask pattern to form a carbon film pattern, and reactive ion etching the substrate along the carbon film pattern using a high density plasma produced by application of a high frequency and a magnetic field, application of a microwave, irradiation of an electron beam, application of a high frequency of not less than 27 MHz, or application of a inductive coupled high frequency.

20 Claims, 16 Drawing Sheets

FOREIGN PATENT DOCUMENTS

| | | |
|---|---|---|
| 60-235426 | 11/1985 | Japan . |
| 62-136025 | 6/1987 | Japan . |
| 62-136820 | 6/1987 | Japan . |
| 63-76438 | 4/1988 | Japan . |
| 63-232334 | 9/1988 | Japan . |
| 1 103837 | 4/1989 | Japan . |
| 1 439 153 | 6/1976 | United Kingdom . |
| 2 129 217 | 5/1984 | United Kingdom . |

OTHER PUBLICATIONS

IBM Technical Disclosure Bulletin; vol. 30, No. 10; Mar. 1988; pp. 402–406; "Carbonized Resist as Directly–Patternable Mask Absorber".

Fiz Technik Datenbank Frankfurt; Abstract AN 2605230; "Hard Carbon Coatings for IR Optical and Heavy Duty Application".

Journal of Technical Disclosure; No. 78–2427, vol. 3–12; Dec. 12, 1978.

"Webster's I New Riverside University Dictionary"; C 1984; Houghton Mifflin Co; Boston, MA; p. 970.

IBM Technical Disclosure Bulletin, vol. 27, No. 7A, Dec. 1984, p. 4102, K.L. Holland, et al., "Polyimide Adhesion to Pre–Treated Silicon Nitride Surfaces".

J. Vac. Sci. Technol. A4(3), May/Jun. 1986, pp. 698–699, V. Vukanovic et al., "Summary Abstract: Polyimide Etching and Passivation Downstream of an O2–CF4–AR Microwave Plasma".

Solid State Technology, Apr. 1985, pp. 243–246, M.L. Hill, et al., "Advantages of Magnetron Etching".

Japanese Journal of Applied Physics, vol. 28, No. 11, Nov. 1989, pp. 2362–2367, S. Noda, et al., "MOS Gate Etching Using an Advanced Magnetron Etching System".

Japanese Journal of Applied Physics, vol. 29, No. 10, Oct. 1990, pp. 2229–2235, K. Ono, et al., "Plasma Chemical View of Magnetron and Reactive Ion Etching of Si With CL2".

Solid State Technology, Feb. 1988, pp. 67–71, R.R. Burke, et al., "Microwave Multipolar Plasma for Etching and Deposition".

J. Vac. Sci. Techol. B 6(6), Nov./Dec. 1988, pp. 1626–1631, Jin–Zhong Yu, "High–Rate Ion Etching of GaAs and Si at Low Ion Energy by Using an Electron Beam Excited Plasma System".

J. Vac. Sci. Technol. B6(1), Jan./Feb. 1988, pp. 284–287, R. Lossy, et al., "Characterization of a Reactive Broad Beam Radio–Frequency Ion Source".

Appl. Phys. Lett. 55(2), Jul. 10, 1989, pp. 148–150, A.J. Perry, et al., "Fast Anisotropic et Etching of Silicon in an Inductively Coupled Plasma Reactor".

Toshiba Review No. 143, Spring 1983, pp. 31–35, H. Okano, et al., "High–Rate Reactive Ion Etching Technology".

J. Appl. Phys. 65(2), Jan. 15, 1989, pp. 464–467, M.J. Cooke, "Anisotropy Control in CF4 Microwave Plasma Etching".

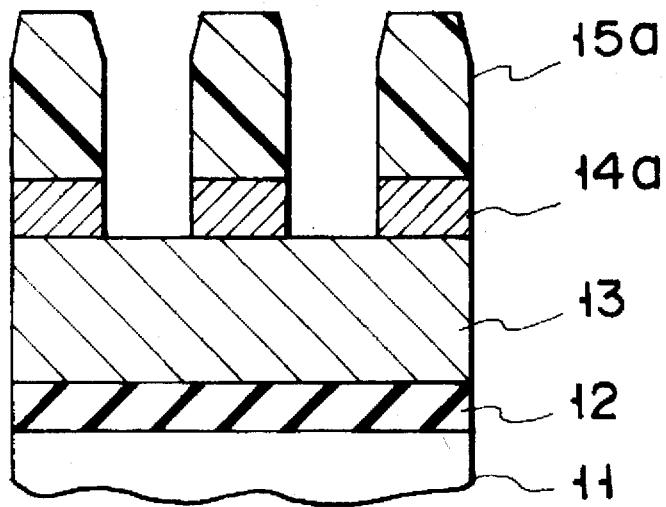
F I G. 3A
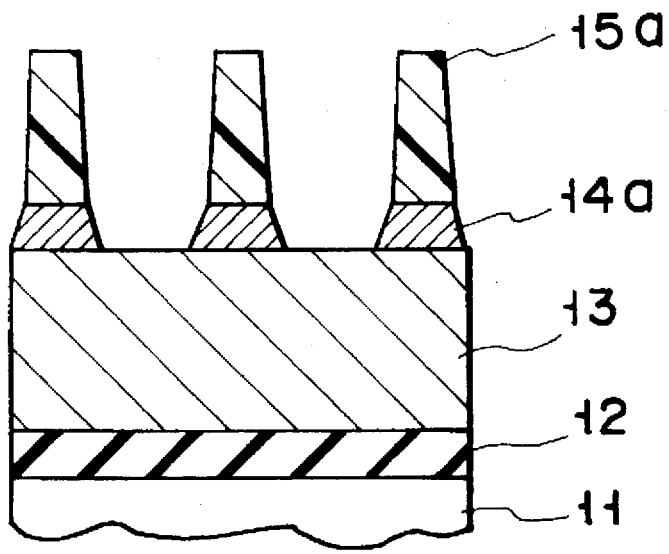
F I G. 3B

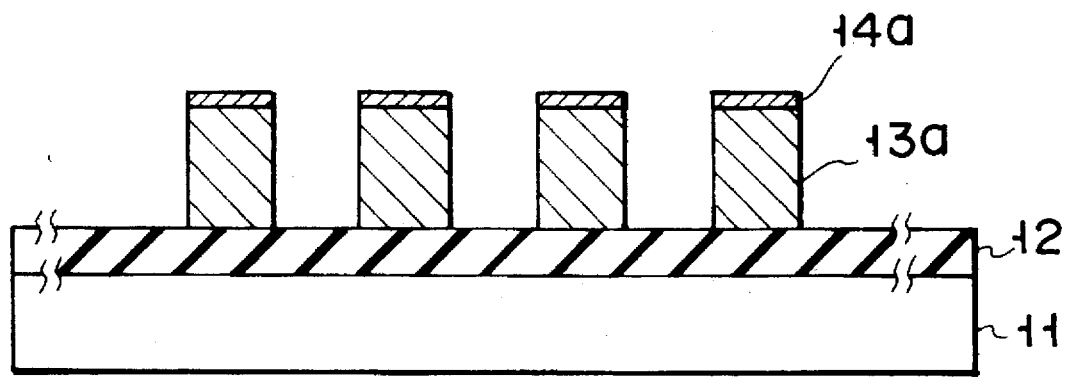
F I G. 7A
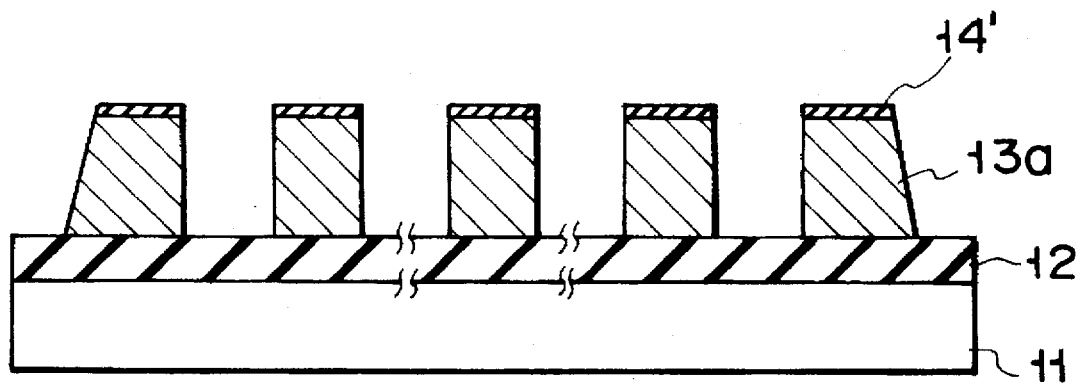
F I G. 7B

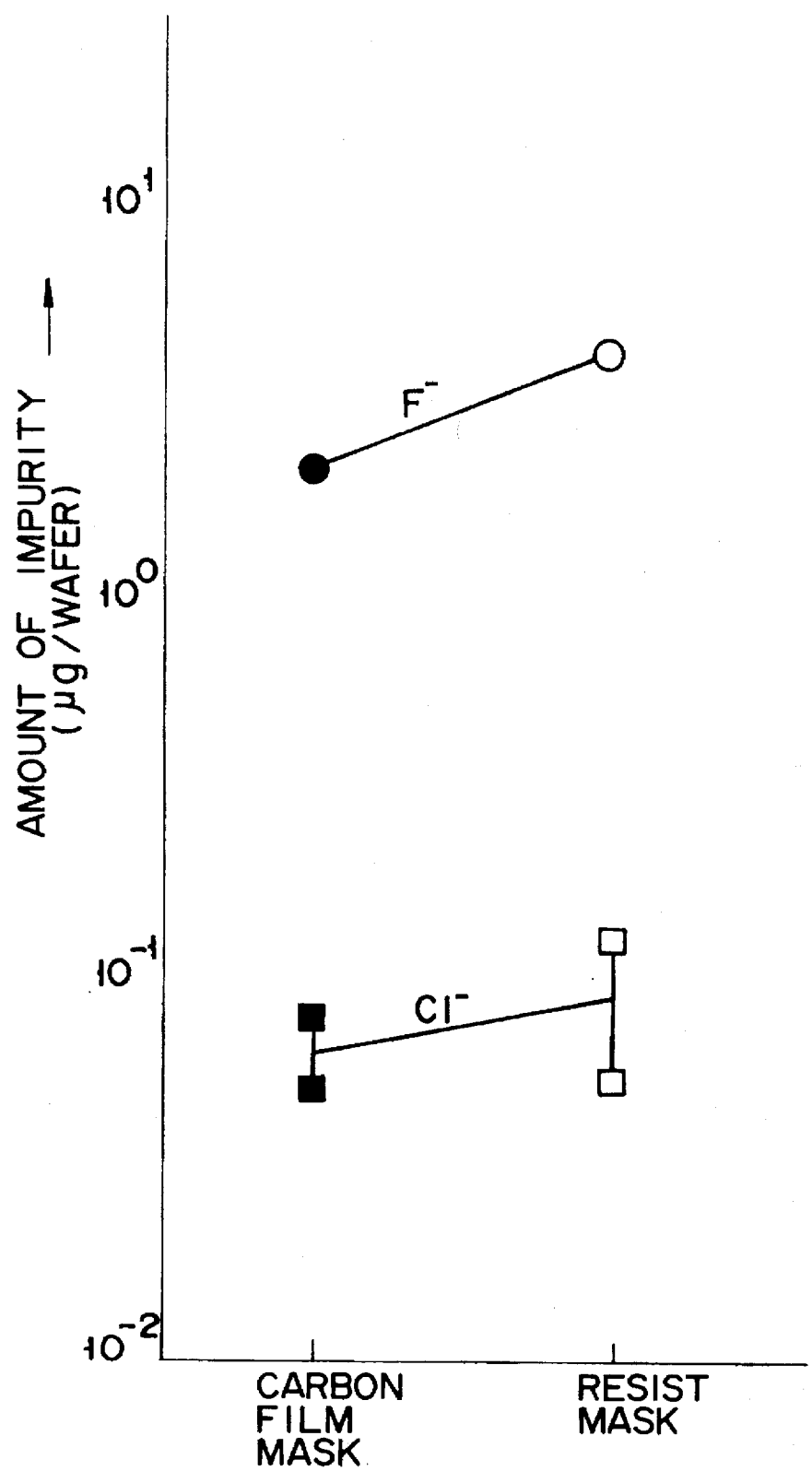
F I G. 11

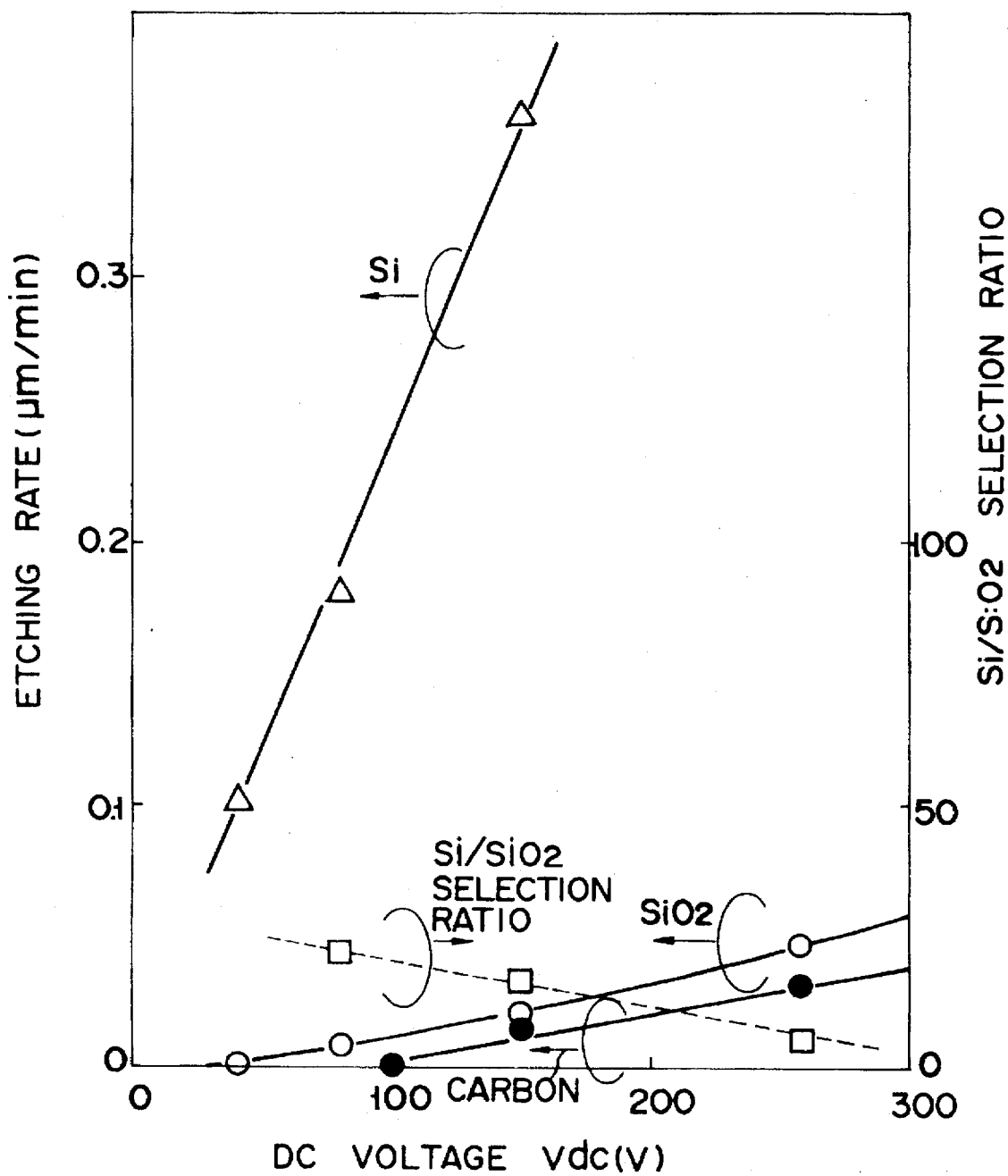
F I G. 15

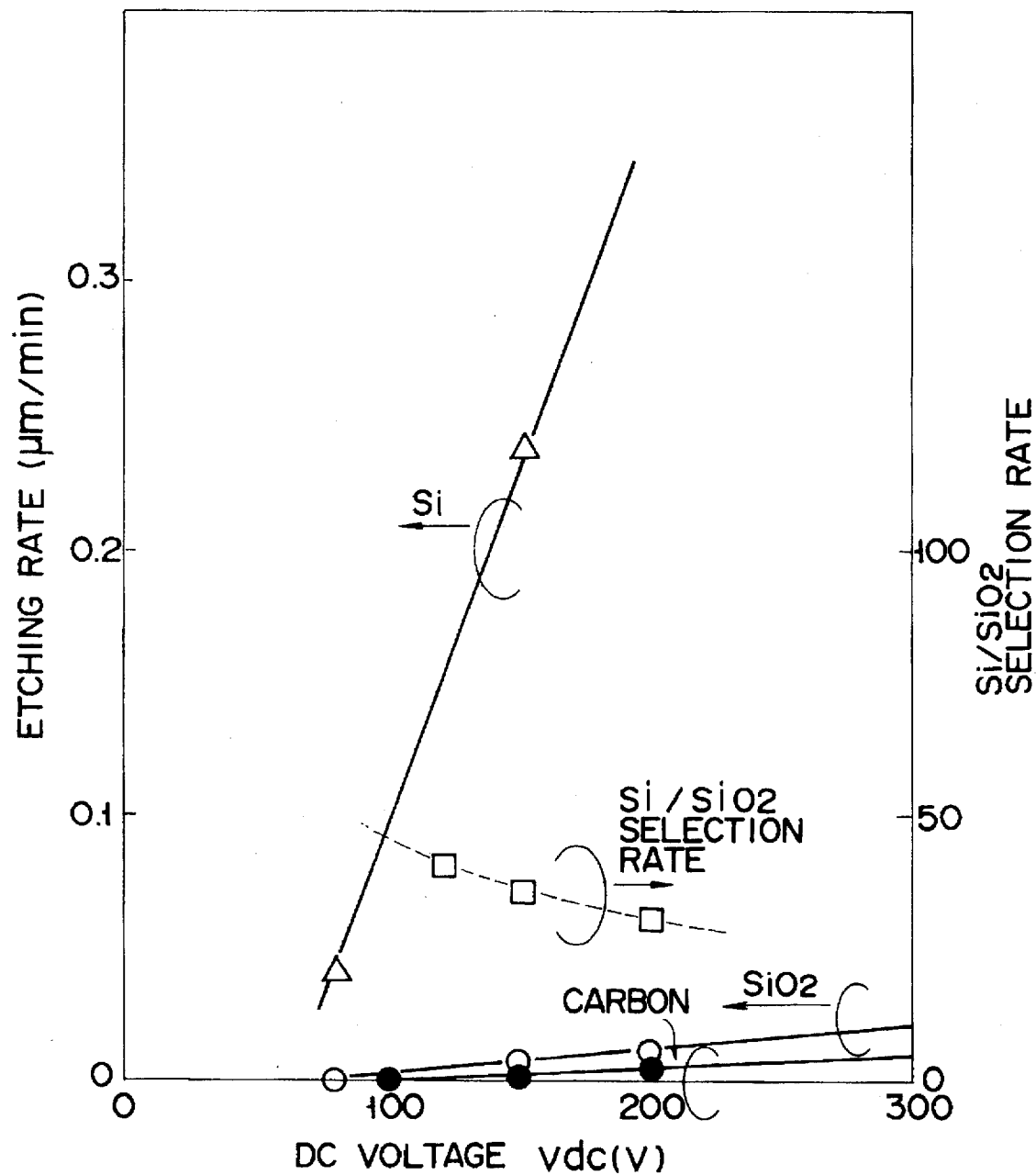
F I G. 16

METHOD OF MANUFACTURING SEMICONDUCTOR DEVICE

This application is a Continuation of application Ser. No. 07/823,813, filed on JAN. 22, 1992, now abandoned.

BACKGROUND OF THE INVENTION

1. Field of the Invention

The present invention relates to a method of a manufacturing a semiconductor device such as a semiconductor integrated circuit and, more particularly, to a method of manufacturing a semiconductor device having an improved dry etching step.

2. Description of the Related Art

In recent years, micropatterning of an element has advanced in accordance with the progress of the technique of a semiconductor integrated circuit, pattern dimensions having high accuracy has been demanded. A semiconductor integrated circuit can be generally obtained by stacking an insulating thin film such as a silicon oxide film having a predetermined pattern and a conductive thin film such as a polysilicon, aluminum, copper, tungsten, or silicide film on a semiconductor substrate such as a silicon substrate.

As techniques for processing the thin film into a predetermined pattern, lithographic, dry etching, and removing techniques are used. In the lithographic technique, after a photosensitive resist is coated on the thin film, the resist is exposed to a light beam or an ultraviolet beam in accordance with the predetermined pattern, and an exposed portion or non-exposed portion is selectively removed by development to form a resist pattern. In the dry etching technique, the underlying thin film is etched using the resist pattern as a mask. In the removing technique, the resist is removed.

However, as a degree of integration of semiconductor elements is increased, the required minimum size becomes small and dimensional precision of a pattern becomes more strict. Recently, a micropattern having a size of 0.5 μm or less has been required. In order to cope with the above pattern in a small region, since the above techniques for forming a pattern have various problems, the techniques must be largely improved.

These problems are described below in detail.

As one method of processing an underlying thin film using a small resist pattern, an RIE method using a plasma is popularly used. According to this method, a substrate on which a target film is deposited is loaded in a vacuum vessel having a pair of parallel plate electrodes, and after the vessel is evacuated, a reactive gas having a halogen element or the like is supplied into the vessel. A plasma is produced by the gas using discharging caused by application of an RF power, and the target film is etched by the produced plasma.

According to this etching method, ions of various particles in the plasma are accelerated by a DC electric field generated at an ion sheath on the surfaces of the electrodes, and the ions having high energy are collided with the target film, thereby performing an ion-assisted chemical reaction. For this reason, etching is performed in the direction of the incident ions, and directional etching having no undercut can be performed.

Since all materials are excited or activated by this ion collision, differences between reactivities unique to materials cannot be easily obtained in this etching compared with etching using only radicals, and a ratio of etching rates of different materials, i.e., a selection ratio is generally low. For example, since an etching rate of a resist is high with respect to Al, a pattern cannot be formed with high accuracy due to a large pattern conversion difference. In addition, since the thickness of a resist is small at a stepped portion, a wiring portion is disadvantageously etched to disconnect wiring lines.

In order to solve the above problem, in etching of an Al film, the following etching method is used. That is, the multi-layered resist is formed on the Al film, a pattern having a high aspect ratio is formed, and the Al film is etched using the pattern as a mask.

In a multi-layered resist, e.g., in three-layered resist process, an organic thin film is coated on a substrate having projections to flatten the substrate, and an inorganic thin film such as a silicon oxide film is formed by an intermediate layer. An upper resist is coated on the intermediate layer, and an uppermost resist pattern is formed by a conventional lithographic means. After the three-layered resist is formed as described above, the intermediate layer is etched using the uppermost resist pattern as a mask by anisotropic etching such as reactive ion etching using a gas having a halogen element as an etching gas, and the lower flattening layer is etched using gas having oxygen to transfer the resist pattern.

In the above three-layered resist process, the substrate is flattened by the lower resist, and the lower resist is patterned using the upper resist having a high resolution, such that an exposure phenomenon can be preferably performed without an influence of the projections of the substrate serving as an underlayer. As a result, a resist pattern having a high resolution and excellent dimensional precision can be formed. However, the three-layered resist process has a large number of steps, and the cost of the process is increased. Due to a high aspect ratio, when the target layer is etched, a microloading effect occurs, and an etching rate considerably depends on a pattern line width.

The most important problem of the multi-layered resists is that a mask such as an inorganic thin film in the multi-layered resist structure cannot be easily removed.

In a conventional step of removing a mask, a resist is dissolved using a sulfuric acid solution or a hydrogen peroxide solution depending on an underlying material, or a resist is removed by a plasma ashing method using oxygen gas. However, the mask formed by the above multi-layered resist method includes an inorganic thin film such as a silicon oxide film. For this reason, only an organic thin film is removed by the above mask removing means, and the inorganic mask cannot be easily removed.

Although the inorganic mask can be removed by dry etching using a gas having a halogen element such as fluorine or chlorine, not only the silicon oxide film of the target underlying substrate but silicon and Al are disadvantageously damaged.

In addition, when an insulating thin film is used as a mask, in an etching method using a plasma, ions and electrons in the plasma are incident. The ions and electrons incident cause charges to be accumulated in the mask (charge-up). For example, when electrons are incident on a mask pattern from a diagonal direction, since the electrons are collided on any one of the right and left walls, amounts of charges to be accumulated in the right and left walls of the mask pattern are different from each other. An electric field newly generated due to asymmetry of the charge amounts in the right and left directions of the walls acts on ions to curve the movement direction of the ions, thereby degrading the anisotropy of the shape of the mask pattern. The micropattern cannot be easily etched with high accuracy.

When a metal material, especially AlSiCu or the like, is to be etched, after a resist film serving as an etching mask is removed and left to stand in the air, corrosion occurs in the metal material. Device characteristics are degraded, and a highly reliable device cannot be easily formed.

A method of dry etching using a carbon film as a mask material has been proposed (Published Unexamined Japanese Patent Application No. 58-212136). In this technique, by using a carbon film having a high etching resistance as an etching mask, an Al film is dry-etched. However, the carbon film cannot be easily processed due to a low etching selection ratio of a resist to the carbon film.

In order to cope with future micropatterning of a semiconductor element, a lithographic technique in which a micropattern is formed such that a resolution is increased by shortening an exposure wavelength is required. However, in this lithographic technique, since a focal depth is decreased in accordance with a decrease in exposure wavelength, the thickness of a resist must be decreased. Therefore, a carbon film having a sufficient thickness cannot be easily processed using a resist pattern as a mask. Therefore, when a carbon film is processed by a dry etching technique using a resist pattern as a mask, and an Al film is dry-etched using the resultant carbon film pattern as a mask, the carbon film is sufficiently thinner than the resist pattern. When the carbon film is used as a mask, direct current voltage (Vdc) applied between the substrate and plasma is high, and the carbon film is etched by conventional reactive ion etching before the Al film is completely etched. Therefore, the Al film cannot be easily etched with high accuracy.

In order to further increase a selection ratio of a carbon film to an Al or Si film, when a pressure is increased and Vdc is decreased, the etching rate of the carbon film is decreased. However, since Al or Si is easily reacted with chlorine or bromine molecules or atoms serving as etching species, side-etching occurs at a side wall of the pattern, and a pattern having a tapered shape or vertical side walls is not easily processed. The pattern dimensional dependency (microloading effect) of an etching rate is conspicuous, and etching cannot be easily performed with high accuracy. When an etching pressure is decreased to suppress the reaction between Al or Si and chlorine or bromine molecules or atoms at the side wall of the pattern, Vdc is increased, etching selection ratio is lowered, the etching rate of Al or Si may be decreased, and discharging may not be maintained. Therefore, this process cannot be practically performed.

As described above, when an Al, Al alloy, or Si thin film is anisotropically etched by reactive ion etching, the following problems are posed.

That is, since a dry etching selection ratio of a resist mask constituted by an organic material to the Al, Al alloy, or Si thin film is low, the thickness of the resist mask is considerably decreased during etching, a highly accurate pattern cannot be obtained.

In the resist mask, an aspect ratio is increased, and the pattern dimensional dependency (microloading effect) of an etching rate is conspicuous, such that etching cannot be performed with high accuracy. In addition, the resist pattern cannot be easily removed after the resist pattern is used as an etching mask.

When a mask is made of an organic material, a mask pattern is charged up in accordance with an amount of charges accumulated in the mask by a balance between ions and electrons incident on the thin film in a plasma. Therefore, the direction of the incident ions is curved, a micropattern cannot be processed with high accuracy.

When an organic thin film is used as a mask material, since the thin film contains an impurity, the impurity is mixed in a plasma during the reactive ion etching to maintain the Al, Al alloy, or Si thin film. Especially, corrosion caused by this contamination occurs.

When an Al or Al alloy thin film is to be dry-etched using a carbon film having a high etching resistance as a mask, since an etching selection ratio of the resist to the carbon film is low, the carbon film having a sufficient thickness cannot be processed with high accuracy. When an etching pressure is increased to increase a selection ratio of the carbon film to Al or Si, side-etching occurs at side wall of the pattern, a pattern having a tapered shape or vertical side walls cannot be easily processed, and microloading effect is conspicuous. In contrast to this, when the etching pressure is decreased, the etching rate of the Al or Si thin film may be decreased, and discharging may not be maintained.

SUMMARY OF THE INVENTION

It is an object of the present invention to provide a method of manufacturing a semiconductor device capable of forming a highly reliable pattern and solving various problems caused by a resist mask during anisotropic etching of an Al, containing film, or Si film.

According to the present invention, there is provided a method of manufacturing a semiconductor device, comprising the steps of forming a carbon film on a surface of a target substrate, forming a mask pattern on the carbon film, etching the carbon film along the mask pattern to form a carbon film pattern, and anisotropically dry etching the target substrate along the carbon film pattern using a high density plasma produced by application of a high frequency and a magnetic field, application of a microwave, irradiation of an electron beam, application of a high frequency of not less than 27 MHz, or application of an induction-coupled high frequency.

According to the present invention, there is also provided a method of manufacturing a semiconductor device, comprising the steps of forming a carbon film on a surface of a target substrate having an aluminum containing layer on a surface thereof, forming a mask pattern on the carbon film, etching the carbon film along the mask pattern to form a carbon film pattern, and anisotropically dry etching the target substrate along the carbon film pattern using a high density plasma produced by application of a high frequency and a magnetic field, application of a microwave, irradiation of an electron beam, application of a high frequency of not less than 27 MHz, or application of a induction-coupled high frequency in a condition that a DC voltage across the plasma and the target substrate is set to be less than 200V.

According to the present invention, there is further provided a method of a manufacturing a semiconductor substrate, comprising the steps of forming a carbon film on a surface of a target substrate having a layer containing silicon as a major constituent on a surface thereof, forming a mask pattern on the carbon film, etching the carbon film along the mask pattern to form a carbon film pattern, and anisotropically dry etching the target substrate along the carbon film pattern using a high density plasma produced by application of a high frequency and a magnetic field, application of a microwave, irradiation of an electron beam, application of a high frequency of not less than 27 MHz, or application of an induction-coupled high frequency in a condition that a DC voltage across the plasma and the target substrate is set to be not more than 100V.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are sectional views showing changes in pattern shape according to Example 1 of the present invention;

FIGS. 7A and 7B are sectional views of patterns for explaining a charge-up phenomenon;

FIG. 11 is a graph showing comparison between impurity amounts when a carbon film pattern and a resist pattern are used as masks;

FIG. 15 is a graph showing a relationship between an etching rate and a selection ratio when an RF voltage is changed using $Cl_2$ gas as an etching gas; and FIG. 16 is a graph showing a relationship between an etching rate and a selection ratio when an RF voltage is changed using HBr gas as an etching gas.

DETAILED DESCRIPTION OF THE PREFERRED EMBODIMENTS

Figure 1A:
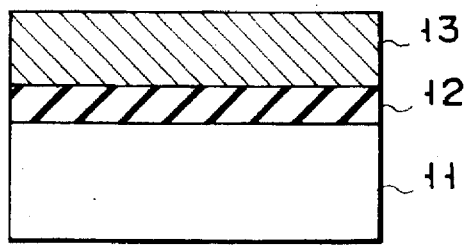
FIGS. 1A to 1G are sectional views showing the steps in forming a pattern according to Example 1 of the present invention.

According to the gist of the present invention, a carbon film pattern is formed as an etching mask for dry etching on a target film, and the target film is anisotropically dry-etched by a high-density plasma using the carbon film pattern as a mask.

As preferred embodiments of the present invention, there are the following embodiments.

(1) In the step of etching a carbon film, any one gas selected from oxygen gas, halogen gas, an inert gas such as neon gas, argon gas, krypton gas, and xenon gas, nitrogen gas, and halogen gas such as $SF_6$ and $CF_4$ is used as an etching gas.

(2) The temperature of a target substrate is controlled within a range of −100° C. to 50° C.

(3) A carbon film is formed by a sputtering method, a vacuum eraporation method, or a CVD method.

(4) After the step of anisotropically etching a target substrate, the substrate is loaded in a vacuum vessel, and the carbon film is removed using an etching gas containing oxygen gas.

(5) After the step of removing a resist using as a target substrate a metal or metal alloy thin film containing aluminum, the target substrate is washed, and the target substrate is anisotropically etched using a gas containing chlorine gas or bromine gas as an etching gas.

(6) Before the step of forming a carbon film using as a target substrate a metal or metal alloy film containing aluminum, plasma processing is performed to the target substrate using oxygen gas.

(7) A target substrate is loaded in a vacuum vessel as a means for removing a resist pattern, a gas mixture constituted by oxygen gas and gas containing at least fluorine is excited in a region other than the vessel, and active species produced by this excitation are supplied to the vacuum vessel, thereby performing down-flow etching.

(8) In a predetermined mask pattern formed by an organic thin film, the organic thin film contains halogen.

In order to examine the dry etching resistance of a carbon film, etching rates of the carbon film, an AlSiCu film, and an Si film were measured by a reactive ion etching apparatus having a pair of parallel plate electrodes and arranged in a conventional vacuum vessel and a reactive ion etching apparatus having a pair of parallel plate electrodes having a magnetron such that a gas mixture of chlorine and boron trichloride, chlorine gas, or hydrogen bromide gas is used, and an etching gas pressure, a high-frequency power density, and a substrate temperature were changed.

The following results could be confirmed from the examination. That is, the etching rates of the carbon film and the resist were increased in inverse-proportion to the etching gas pressure or in proportion to the high-frequency power density, and the substrate temperature dependency of the etching rates was low. The etching rates of the AlSiCu film and the Si film were increased in proportion to the etching pressure. Although a large change in AlSiCu film could not detected with respect to the high-frequency power density, the etching rate of the Si film is increased in relation to the high-frequency power density. Therefore, an etching selection ratio of the AlSiCu film or Si film to the carbon film and the resist can be increased as the high-frequency power density is decreased and as the etching pressure is increased.

In addition, in order to examine etching characteristics in detail, a relationship between an etching rate and a DC voltage applied to a plasma and a substrate was examined while a high-frequency power density was changed. As a result, the following could be understood. That is, the carbon film was not etched by chlorine or bromine when the DC current was set within a range of 0 to 100V: The etching rate of the carbon film was increased in proportion to the DC current when the DC current was set in 100V or more. The etching rate of the resist or the Si film was linearly increased with an increase in DC current. As to a gas mixture of chlorine and boron trichloride, the carbon film was not etched thereby when the DC current was set within a range of 0 to 70V. The etching rate of the carbon film was increased in proportion to the DC current when the DC current was set in 70V or more. The the etching rate of the AlSiCu film was not largely changed as the DC current.

Therefore, when the DC current was set within a range of 0 to 250V, although a selection ratio of the AlSiCu film or the Si film to the resist was set to be constant, i.e., about 1.5 to 3, a selection ratio of the AlSiCu film or the Si film to the carbon film could be set to be 5 to infinity.

In conventional reactive ion etching using a pair of parallel plate electrodes, since the DC voltage was decreased as the pressure was increased, a selection ratio of the AlSiCu film to the carbon film was increased. However, since the reaction between the Al or Si film and chlorine or bromine molecules or atoms serving as etching species was easily performed, side-etching occurred at a side wall of the pattern, and a pattern having a tapered shape or vertical side walls could not be obtained.

In addition, the pattern dimensional dependency (microloading effect) of an etching rate was conspicuous, and etching could not performed with high accuracy. Therefore, the etching pressure must be decreased to suppress the reaction of chlorine or bromine molecules or atoms and the Si or Al film at the side wall of the pattern.

In contrast to this, in reactive ion etching using a pair of parallel plate electrodes having a magnetron, even when an etching pressure was decreased, discharging could be maintained, and a high selection ratio could be obtained.

Examples of the present invention will be described below with reference to the accompanying drawings.

EXAMPLE 1

FIGS. 1A to 1G are sectional views showing the steps in forming an Al alloy film pattern according to an example of the present invention.

Figure 1B:
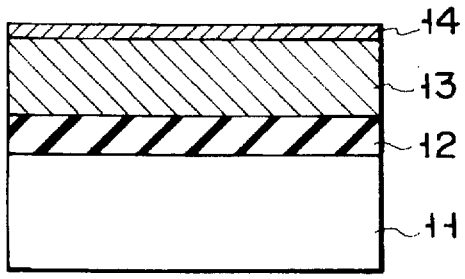

As shown in FIG. 1A, an $SiO_2$ film 12 was formed on an Si substrate 11, and an AlSiCu thin film 13 (Si concentration: 1 wt %; Cu concentration: 0.5 wt %; thickness: 0.8 μm) was deposited on the SiO2 film 12. As shown in FIG. 1B, a carbon film 14 (thickness: 300 nm) was formed on the thin film 13.

In this case, the carbon film 14 was deposited by a magnetron sputtering apparatus. A degree of vacuum was set in about $10^{-8}$ Torr before sputtering was performed. After Ar gas serving as a sputtering gas was supplied to set the degree of vacuum at $5\times10^{-3}$ Torr, a carbon target was sputtered by Ar ions at a high-frequency power of 1 kW, thereby depositing the carbon film 14. The thickness of the deposited film could be controlled by a change in sputtering period. However, when the carbon film 14 was formed on the AlSiCu thin film 13 by the above method, the carbon film 14 was partially peeled from the Si substrate.

In order to improve the adhesion property between the AlSiCu thin film 13 and the carbon film 14, the surface of the AlSiCu thin film 13 was exposed to a plasma using oxygen gas before deposition of the carbon film to obtain the modified AlSiCu thin film 13. When the AlSiCu thin film processed by an oxygen gas plasma and a non-processed AlSiCu thin film were analyzed by an Auger electron spectroscopy (AES) method, an increase in oxygen concentration was detected on the surface of the AlSiCu film processed by the plasma.

The carbon film 14 (thickness: 300 nm) was deposited under the same conditions as described above on the AlSiCu thin film 13 processed by the oxygen gas plasma. After the carbon film 14 was deposited, when peeling of the film was observed, any peeling of the carbon film 14 was not detected throughout the Si substrate 11. In order to clarify the crystalline structure of the carbon film 14, when the film was analyzed by an X-ray diffraction (XRD) method, it was found that this film had an amorphous structure. In addition, when the carbon film 14 was analyzed by a secondary ion mass spectroscopy (SIMS) method, it was found that an amount of impurity atoms other than carbon atoms was smaller than the detection sensibility of the AES method.

Figure 1C:
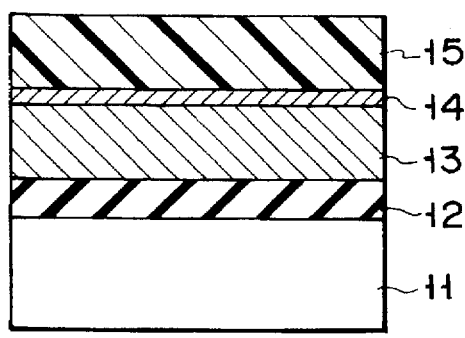
Figure 1D:
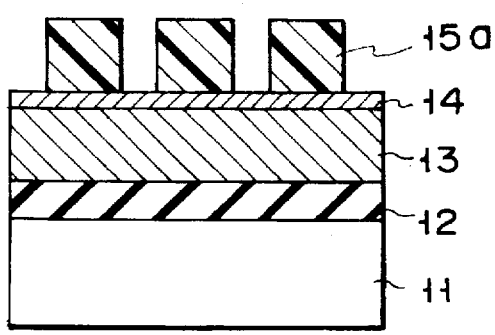

As shown in FIG. 1C, a photoresist 15 (thickness: 1.3 μm) of novolak resin was coated on the carbon film 14, and the resist 15 was exposed by conventional lithographic technique. Subsequently, as shown in FIG. 1D, the resist 15 was developed to form a resist pattern 15a having a line-and-space of 0.5 μm. In the step shown in FIG. 1D, although an alkaline organic solution was used as a developer, any elution or peeling of the carbon film 14 was not detected during the developing.

Figure 1E:
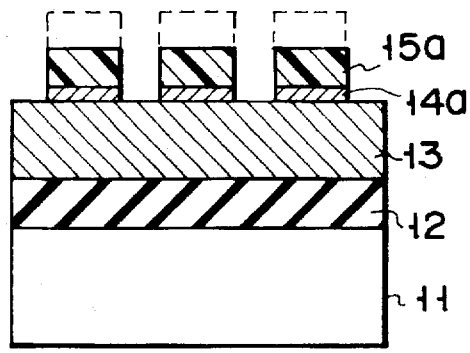
Figure 1F:
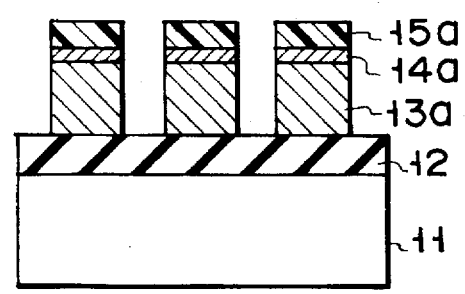

As shown in FIGS. 1E and 1F, the carbon film 14 and the AlSiCu thin film 13 were selectively etched by RIE using the resist pattern 15a as a mask to form a carbon film pattern 14a and an AlSiCu film pattern 13a.

The steps shown in FIGS. 1E and 1F will be described below.

Figure 2:
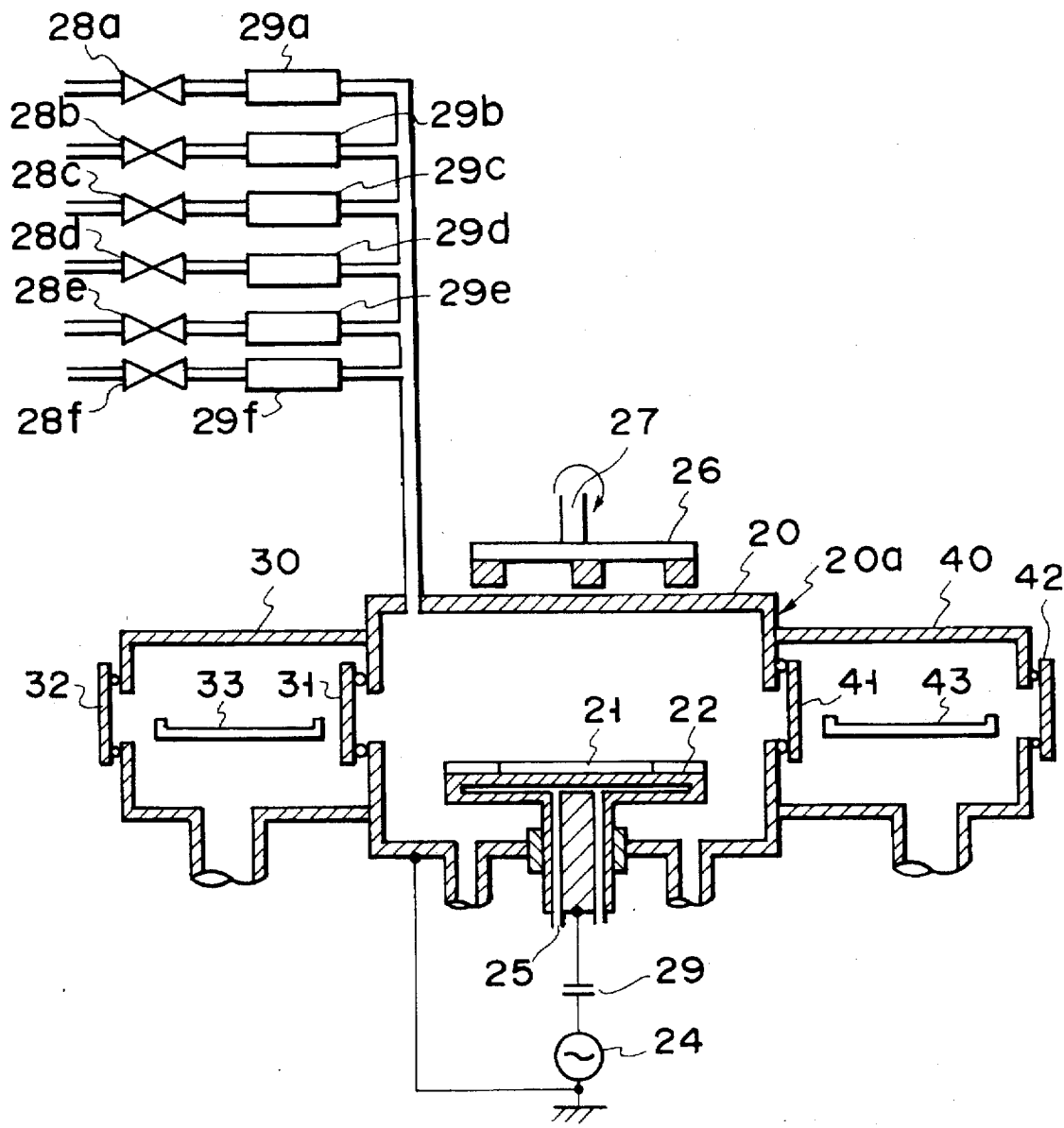
FIG. 2 is a schematic view showing an arrangement of an etching apparatus used in Example 1.

First, a dry etching apparatus employed to this example will be described below with reference to FIG. 2.

This apparatus is constituted by an etching chamber 20, a loading preliminary chamber 30, and an unloading preliminary chamber 40, and the etching chamber 20, the loading preliminary chamber 30, and the unloading preliminary chamber 40 are partitioned by gate valves 31 and 41, respectively. The etching chamber 20 is kept evacuated, a target substrate is loaded from a gate valve 32 arranged in the loading preliminary chamber 30, and the target substrate is unloaded from a gate valve 42 arranged in the unloading preliminary chamber 40, thereby preventing the substrate from being adversely affected by, i.e., humidity or oxygen in the air. In addition, substrate mounting tables 33 and 43 are arranged in the preliminary chambers 30 and 40, respectively.

The etching chamber 20 comprises a first electrode 22 for mounting a target substrate 21 arranged in a vacuum vessel 20a, a high-frequency power source 24 connected through a blocking capacitor 29 for applying a 13.56-MHz high-frequency power to the first electrode 22, and a cooling pipe 25 for cooling the first electrode 22 and controlling the substrate temperature of the target substrate 21 at a predetermined temperature. When the target substrate must be heated, heating fluid flows through the pipe.

While $Cl_2$, $BCl_3$, HBr, $O_2$, $H_2$, and He (Ar or Kr) are supplied in the vacuum vessel 20a from a chlorine gas ($Cl_2$) supply line 28a, a boron trichloride ($BCl_3$) supply line 28b, a hydrogen bromide (HBr) supply line 28c, an oxygen gas ($O_2$) supply line 28d, an inert gas (He, Ar, or Kr) supply line 28e, and a hydrogen gas ($H_2$) supply line 28f, respectively, a high-frequency voltage is applied across the first electrode 22 and the inner wall (upper wall) of the vacuum vessel 20a serving as a second electrode.

At this time, the vacuum vessel 20a is grounded. The gas supply lines 28a to 28f have valves and flow rate adjustors 29a to 29f, respectively, so as to control their flow rates and gas pressures at predetermined values, respectively.

A permanent magnet 26 made of Sn—Co is arranged above the second electrode portion of the vacuum vessel 20a and eccentrically rotated about a rotating shaft 27 by a motor. A high-density plasma can be produced and maintained by a magnetic field of 50 to 500 gauss generated from the permanent magnet 26 even in a high degree of vacuum of $10^{-3}$ Torr or more. A large amount of ions are extracted from the high-density plasma produced as described above to be radiated on the target substrate 21, thereby etching the target substrate 21. In this case, a distance between the target substrate 21 and the permanent magnet 26 is set to 28 mm, and a magnetic field strength on the surface of the target substrate 21 is set to 150 gauss. A cathode drop voltage Vdc of 30V is easily realized.

A case wherein the carbon film 14 serving as a material to be etched is etched using the above dry etching apparatus such that $O_2$ or $H_2$ gas is used as an etching gas and that the resist pattern 15a is used as a mask will be described below as shown in FIG. 1E.

As shown in FIG. 1E, the carbon film 14 was etched using $O_2$ gas as an etching gas while a substrate temperature was changed. As etching conditions, an $O_2$ gas (flow rate: 100 SCCM) pressure was set at 1.5 Pa, and a high-frequency power of 1.7 W/cm² was applied.

When the substrate temperature was kept at −50° C., although the carbon film 14 was etched at a rate of about 300 nm/min, the resist 15a was etched at a rate of 1 μm/min, and a selection ratio of the carbon film 14 to the resist pattern 15a was about 0.3. When the shape of the carbon film pattern 14a was observed with an SEM, a shape having substantially vertical side walls could be obtained, as shown in FIG. 3A.

When the substrate temperature was kept at 70° C., the selection ratio of the carbon film 14 to the resist pattern 15a was about 0.3 which was substantially same as that obtained when the substrate temperature was set at −50° C. When the shape of the etched carbon film pattern 14a was observed by the SEM, it was found that the carbon film pattern 14a had a tapered shape as shown in FIG. 3B.

As shown in FIG. 3B, the resist pattern 15a remaining on the carbon film pattern 14a was side-etched to thin the resist pattern 15a. That is, when the substrate temperature was low, since a side-etching amount was considerably decreased, the carbon film 14 could be found to be substantially vertically etched.

The side-etching amount of the resist pattern 15a is determined by the number of oxygen ions radiated on the side walls of the resist pattern during RIE using $O_2$ gas, a rate of the reaction between oxygen radicals and the resist, and an eluting amount of the reaction products. It can be understood that the side-etching amount is suppressed by a decrease in reaction rate, a decrease in eluting amount of the reaction products from the side walls, formation of side protection films, which are caused by setting the substrate temperature at a low temperature. Therefore, the resist was etched using various gases. As a result, it was found that a selection ratio of the carbon film to the resist was increased using $H_2$ gas even at a relatively high temperature.

The above dry etching apparatus was used, $H_2$ gas (total amount: 100 SCCM) was used as an etching gas, a pressure was set at 1.5 Pa, a high-frequency power was set at 1.7 W/cm², and a substrate temperature was set at 25° C. The carbon film 14 was selectively etched using the resist 15a as a mask under these conditions. At this time, although the carbon film 14 was etched at a rate of 33 nm/min, the resist pattern 15a was etched at a rate of 67 nm/min. Therefore, the selection ratio of the carbon film 14 to the resist pattern 15a was about 0.5. In addition, when the pattern shape was observed with an SEM, it was found that the resist pattern 15a was not side-etched and that the carbon film pattern 14a was substantially vertically etched as shown in FIG. 3A.

A case wherein an inert gas is used as an etching gas and the carbon film 14 is etched by an sputtering effect will be described below. The above dry etching apparatus was used, Ar gas (total amount: 100 SCCM) was used as an etching gas, a pressure was set at 1.5 Pa, a high-frequency power of 1.7 W/cm² was used, and a substrate temperature was set at 25° C. The carbon film 14 was etched using the resist pattern 15a as a mask under these conditions.

At this time, although the carbon film 14 was etched by sputtering at a rate of 40 nm/min, the resist pattern 15a was etched at a rate of 100 nm/min. Therefore, a selection ratio of the carbon film 14 to the resist pattern 15a was 0.4. In addition, when the pattern shape after this etching was observed with an SEM, the resist pattern 15a was not side-etched, and the carbon film 14 could be vertically etched. This was based on the following assumption. That is, since etching was performed by an sputtering effect when an inert gas was used, the carbon film 14 having vertical side walls could be obtained.

Therefore, in this example, the carbon film 14 was processed by reactive ion etching using $O_2$ gas, which can etched carbon at high etching rate, to form the carbon film pattern 14a.

As described above, when $O_2$ gas is used, the etching rate of the carbon film was about 0.3 times the etching rate of the resist. Therefore, when overetching occurred due to a microloading effect or the like caused by the above reactive ion etching in the case of the carbon film thickness of 1.3 μm and resist film thickness of 1.3 μm, the remaining resist has a thickness of about 0.5 μm.

As shown in FIG. 1F, the AlSiCu film 13 was selectively etched using the resist pattern 15a and the carbon film pattern 14a as masks. In this etching of the AlSiCu film 13, the dry etching apparatus shown in FIG. 2 was used. Etching conditions were set as follows. That is, a substrate temperature was kept at 50° C., and a gas mixture (flow rate: 100 SCCM) of $Cl_2$ gas and $BCl_3$ gas was used as an etching gas. An etching pressure was 4.0 Pa or less, and in this case was set at 2.0 Pa, and an RF power was changed from 0.8 W/cm² to 3 W/cm².

Figure 4:
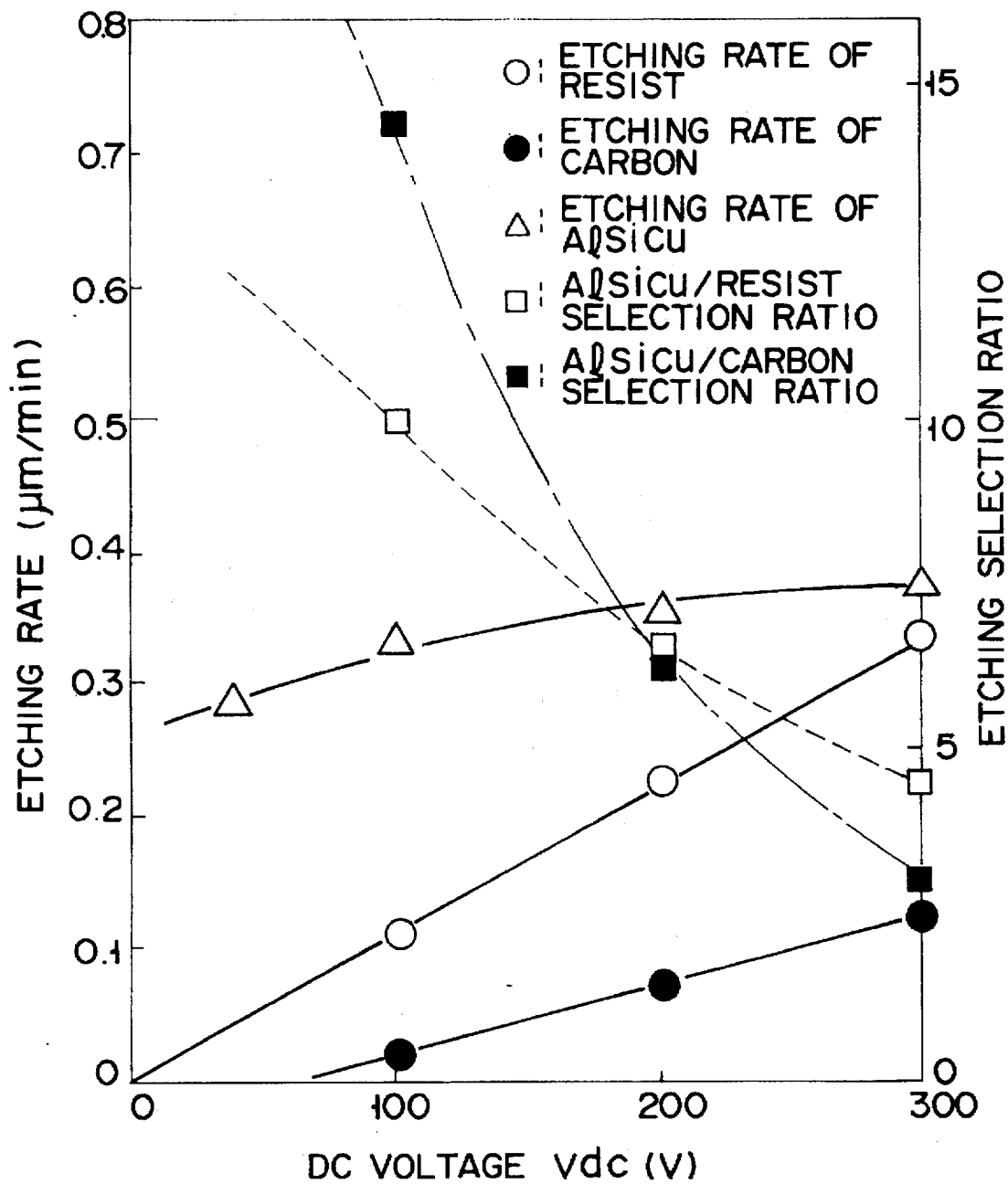
FIG. 4 is a graph showing a relationship between an etching rate and an etching selection ratio when an RF power is changed.

FIG. 4 is a graph showing resultant values obtained by measuring a relationship between an etching rate and a cathode drop voltage, i.e., a DC voltage (Vdc) applied across a plasma and the substrate when various films are etched while the RF power density is changed.

As apparent from FIG. 4, when the RF power is set at 0.8 W/cm² (Vdc: 100V), the following resultant values can be obtained. That is, the AlSiCu thin film 13 is etched at a rate of about 330 nm/min, the etching rate of the carbon film 14 is etched at a rate of about 25 nm/min, and, a selection ratio of the AlSiCu thin film 13 and the carbon film 14 is about 13. On the other hand, a selection ratio of AlSiCu thin film 13 to the resist 15 is about 3.

When the shape of the etched AlSiCu thin film pattern 13a was evaluated with an SEM, it was found that the shape was tapered to have a taper angle of 88°. In addition, it was cleared that the size of the tapered shape was increased (the taper angle was decreased) as the RF power density was increased.

It was confirmed by the SEM in the same manner as described above that, after overetching of 20%, the resist pattern 15a did not remain on the AlSiCu thin film pattern 13a obtained by etching the AlSiCu thin film 13 using an RF power of 1.3 W/cm² (Vdc: 150V) or more and the resist pattern 15a as a mask after the etching was performed.

As a comparative example, the resist film 15 (film thickness of 1.3 μm) was formed on the AlSiCu thin film 13 in place of a carbon film, and the resist film 15 was exposed and developed, thereby forming a 0.4-μm L/S (line and space) pattern. The dry etching apparatus having the magnetron was used, and the AlSiCu thin film 13 was etched using the resist pattern 15a as a mask such that a DC voltage (Vdc) was changed.

Suppose that, in the processing step of the carbon film 14, the thickness $t_R$ of the resist film 15 is decreased by $t_C/k$, where $t_C$ denotes the thickness of the carbon film 14 and k denotes the etching selectivity ratio of the carbon film 14 to the resist film 15. The decrease in the thickness $t_C$ noted above causes the remaining resist film to be thicker in the Comparative Example in which a resist pattern in used as a mask. It follows that, where the thickness of the resist film is the same, the masking property is improved in the case of using an interposed carbon film, if the condition of $t_C \cdot S_C > t_C \cdot 1/k \cdot S_R$, i.e., $S_C > 1/k \cdot S_R$, where $S_C$ denotes the etching selectivity ratio of the AlSiCu film 13 to the carbon film 13, and $S_R$ denotes the selectivity ratio of the AlSiCu film 13 to the resist film 15, is satisfied in the etching step of the AlSiCu film 13.

In the step of processing the carbon film 14 by reactive ion etching using $O_2$ gas, since the etching rate of the carbon film is about 0.3 times the etching rate of the resist. Therefore, it is found that a carbon film is used more advantageously than the resist as an etching mask for the AlSiCu thin film 13 using a DC voltage (less than 200V) at which a selection ratio of the AlSiCu thin film 13 to the carbon film 14 is larger than the value of three times a selection ratio of the AlSiCu thin film 13 to the resist 15.

When a DC voltage was changed using a conventional dry etching apparatus having a pair of parallel plate electrodes but having no magnetron, and the AlSiCu thin film 13 was etched, stable discharging was not obtained at a low pressure and a DC voltage of less than 200V.

Figure 1G:
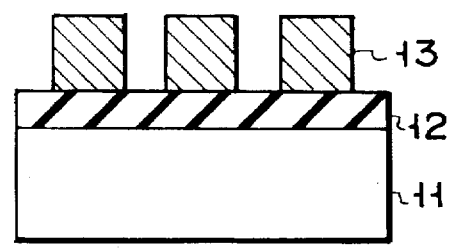

Finally, as shown in FIG. 1G, the resist pattern 15a and the carbon film pattern 14a were removed. A conventional barrel type plasma etching apparatus was used as an etching apparatus. When the resist pattern 15a and the carbon film pattern 14a were subject to ashing by the above apparatus using a normal oxygen plasma, the resist pattern 15a and the carbon film pattern 14a could be found to be easily removed.

Figure 5:
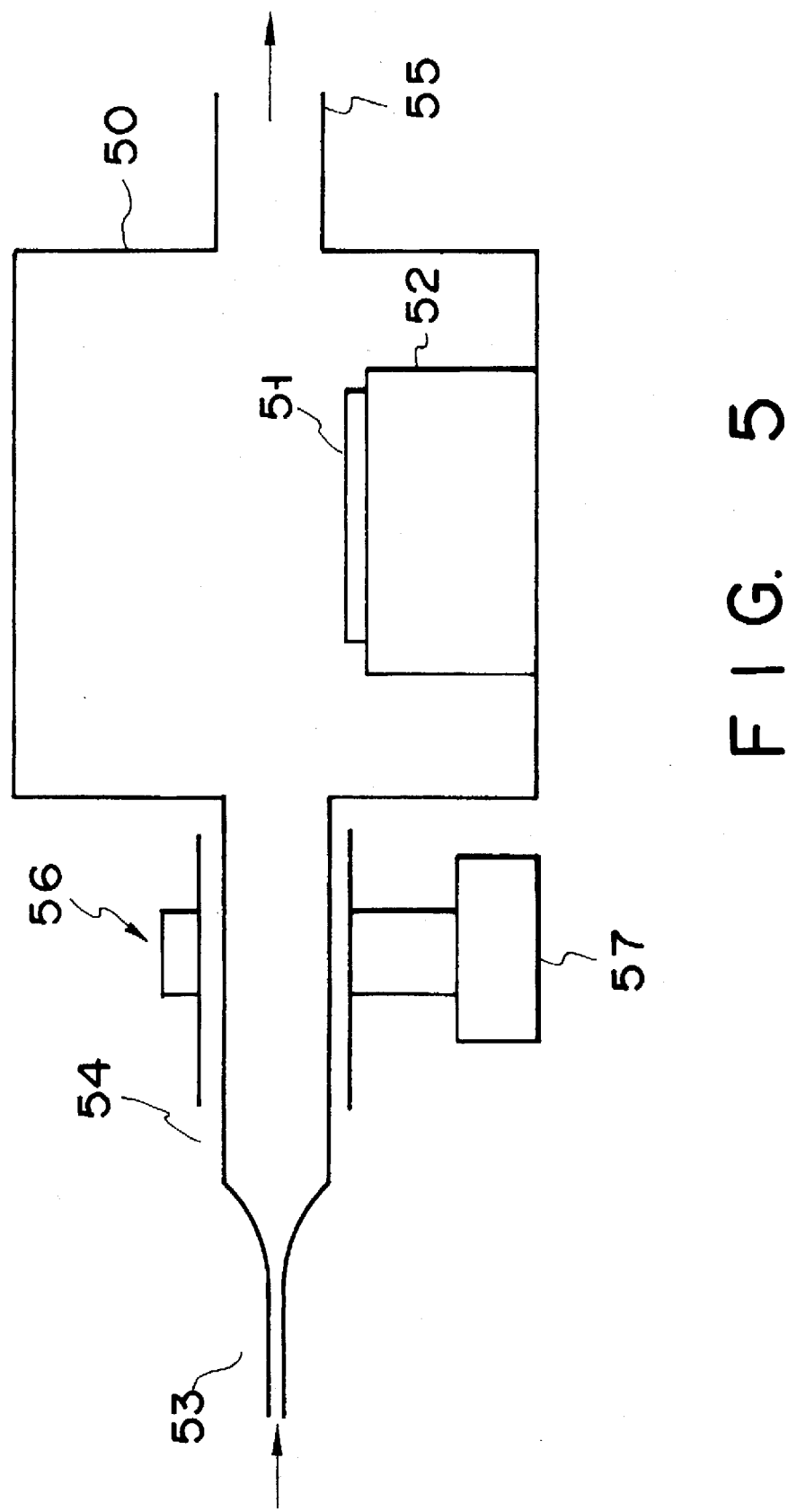
FIG. 5 is a schematic view showing a down-flow etching apparatus used in a method according to Example 1.

As another removing method, there is a method of removing the carbon film pattern 14a after the resist pattern 15a is selectively removed with respect to the carbon film pattern 14a. A down-flow etching apparatus shown in FIG. 5 was used to completely remove the resist pattern 15a. FIG. 5 is a schematic view showing the down-flow etching apparatus, used in this example, for selectively removing the resist pattern 15a with respect to the carbon film pattern 14a.

The main part of this apparatus is constituted by a vacuum vessel 50, a sample table 52 which is arranged in the vacuum vessel 50 and on which a sample 51 is mounted, a gas supply port 53 from which gas is supplied, a quarts discharge tube 54 for discharging gas supplied from the gas supply port 53, and a gas exhaust port 55 for exhausting the gas supplied in the vessel. A microwave having a frequency of 2.45 GHz is applied from a microwave power supply 57 to the discharge tube 54 through a waveguide 56 to generate non-electrode discharging, thereby decomposing the gas supplied from the gas supply port 53.

In the sample, a resist pattern was removed using the above etching apparatus. The sample 51 having a structure (resist/carbon/AlSiCu/SiO$_2$) in which a carbon film was vertically etched by RIE using the resist pattern as a mask to expose an underlying AlSiCu thin film at a pattern opening portion was loaded in the down-flow etching apparatus shown in FIG. 5 and fixed on the sample table 52. After the apparatus was evacuated from the exhaust port 55 to have a degree of vacuum of $10^{-3}$ Torr, a $CF_4/O_2$ gas mixture was supplied to the apparatus as an etching gas. The flow rates of the $CF_4$ and $O_2$ gases were kept to be constant, i.e., 15 SCCM and 500 SCCM, respectively, and a pressure of 0.3 Torr was maintained. In addition, a temperature in the apparatus was kept at room temperature. A microwave was applied to cause discharging, thereby performing an etching operation.

In the above step, when ashing was performed by the down-flow etching apparatus at a pressure of 0.3 Torr using the gas mixture of carbon tetrafluoride ($CF_4$) gas and oxygen gas as an etching gas, the resist pattern could be removed without any residue.

Under the conditions that the resist pattern could be completely removed, when the etching of the carbon film pattern was examined, it was found that the etching rate of the carbon film pattern was 16 Å/min., compared with an etching rate 1 μm/min. of the resist film in the down-flow etching, and the carbon film was not substantially etched.

Therefore, in a removing operation of the mask pattern when the resist pattern was left, it could be confirmed that the carbon film pattern could be removed by performing normal $O_2$ plasma ashing using the barrel type etching apparatus as described above after the resist was removed by down-flow etching using a gas mixture of $CF_4$ gas and $O_2$ gas. After the carbon pattern was removed, when the AlSiCu thin film pattern was evaluated, it was found that the AlSiCu thin film having a taper shape and line/space widths of 0.4 μm/10.4 μm was preferably formed.

The carbon film was also dry-etched using a gas such as $H_2$ gas, an inert gas (Ne, Ar, Kr, or Xe), $N_2$, halogen gas ($SF_6$, $CF_4$) or a gas mixture of these gases as a resist mask. The carbon film could be preferably etched using $O_2$ gas or any one of these gases or the gas mixture, and an AlSiCu thin film pattern having a preferable shape and no residue could be formed by the above process.

EXAMPLE 2

An etching method of an AlSiCu thin film using a two-layered resist method will be described below as Example 2 of the present invention. FIGS. 6A to 6H are sectional views showing the steps in forming a pattern according to Example 2 of the present invention.

Figure 6A:
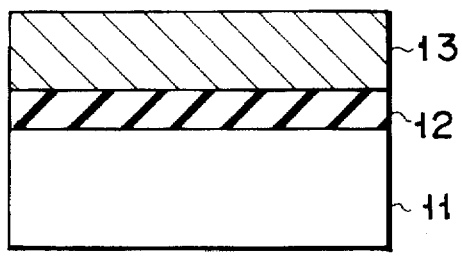
FIGS. 6A to 6H are sectional views showing the steps in forming a pattern according to Example 2 of the present invention.

As shown in FIG. 6A, an SiO$_2$ film 12 was formed on an Si substrate 11, an AlSiCu (Si concentration: 1 wt %; Cu concentration: 0.5 wt %) thin film 13 was deposited on the surface of the SiO$_2$ film 12. Thereafter, the surface of the AlSiCu thin film 13 was modified by an O$_2$ plasma.

Figure 6B:
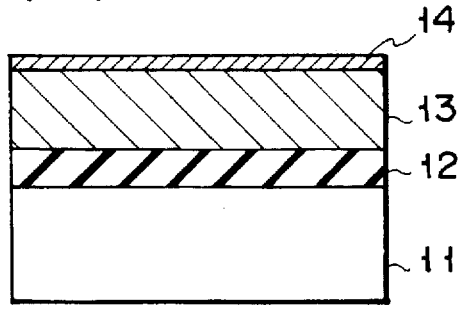

As shown in FIG. 6B, a carbon film 14 (film thickness: 200 nm) was formed on the thin film 13. At the same time, as a comparative example, a sample on which a silicon oxide film (SiO$_2$) 14' was formed to have a thickness of 200 nm was formed by sputtering. In this case, the carbon film 14 was deposited following the same procedures as in Example 1.

Figure 6C:
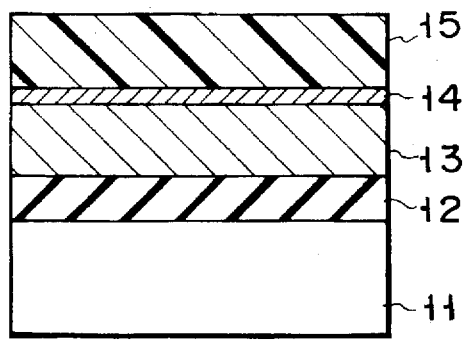
Figure 6D:
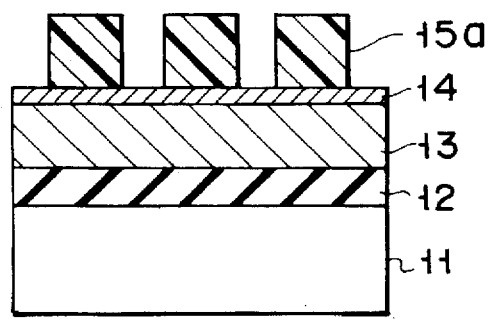

As shown in FIG. 6C, a resist film 15 having a thickness of 1.3 μm was deposited on each of the carbon film 14 and the SiO$_2$ film, and each of the resist film 15 was exposed and developed by a conventional lithographic technique as shown in FIG. 6D to form a resist pattern 15a. In the step shown in FIG. 6D, any problem such as elution or peeling of the SiO$_2$ film was not posed.

Figure 6E:
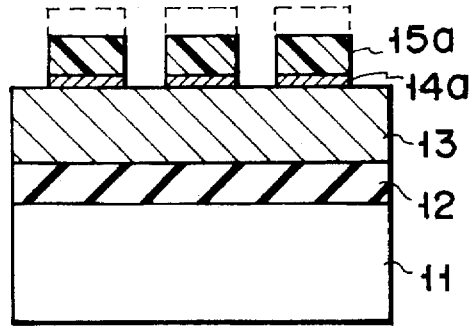

As shown in FIG. 6E, the carbon film 14 was patterned by RIE using the resist pattern 15a as a mask. In this patterning, an RIE apparatus having a magnetron was used as a dry etching apparatus. As described in Example 1, the carbon film 14 was etched using the resist pattern 15a as a mask under conditions of an $O_2$ gas flow rate of 100 SCCM, a pressure of 1.5 Pa, an RF power of 1.7 W/cm$^2$, and a substrate temperature of $-50°$ C. As a result, as shown in FIG. 6E, the carbon film 14 was patterned. The resist pattern 15a was left on the carbon film pattern 14a.

By using the same etching apparatus as described above, the $SiO_2$ film 14' was patterned using the resist pattern 15a as a mask. That is, the $SiO_2$ film 14' was etched using the resist pattern as a mask under conditions of $CF_4/O_2$ gas flow rate of 70/30 SCCM, a pressure of 1.5 Pa, an RF power of 1.7 W/cm$^2$, and a substrate temperature of 25° C. As a result, as in FIG. 6E, the $SiO_2$ film 14' was patterned. The resist pattern was left on the $SiO_2$ film 14'.

Figure 6F:
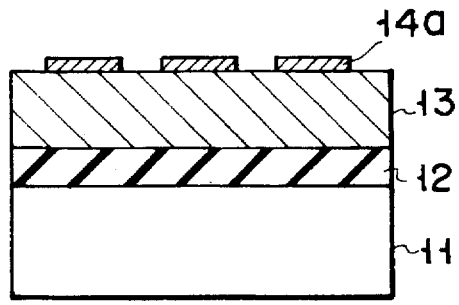

As shown in FIG. 6F, in order to remove the resist pattern remaining on each of these thin films, the resist pattern 15a was removed by a down-flow ashing apparatus using $CF_4/O_2$ gas described in Example 1. As a result, the resist pattern 15a on each of the carbon film pattern 14a and the $SiO_2$ film 14' was entirely removed to form an etching mask pattern formed by the carbon film pattern 14a and an etching mask pattern formed by the $SiO_2$ film 14'. Then, the substrate was washed by a pure water.

Figure 6G:
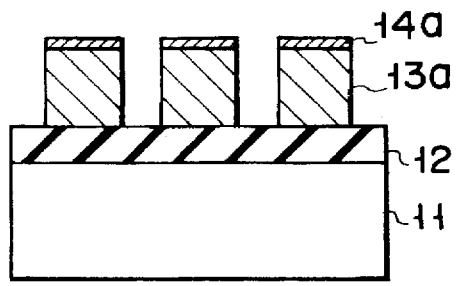

As shown in FIG. 6G, the AlSiCu thin films 13 were etched using the carbon film 14 as an etching mask, respectively. The AlSiCu thin films 13 were etched using a magnetron dry etching apparatus and using a gas mixture of $Cl_2$ and $BCl_3$ as an etching gas such that a DC voltage was changed at an etching pressure of 2.0 Pa. As a result, an etching selectivity ratio of the carbon mask to the AlSiCu film was about 5 at a direct current voltage of 250V, and the etching selectivity ratio of those was 6.5 or more at a direct current voltage of 200V or less.

The AlSiCu films 13 were etched using the carbon film pattern 14a and the $SiO_2$ film pattern 14' as masks, respectively, and a gas mixture of $Cl_2$ gas and $BCl_3$ gas as an etching gas under conditions of an etching pressure of 0.5 Pa and a high-frequency power of 0.8 W/cm$^2$.

At this time, the AlSiCu thin film 13 was etched at a rate of about 300 nm/min, the carbon film pattern 14a was etched at a rate of about 35 nm/min, and the $SiO_2$ film pattern 14' was etched at about 40 nm/min. A selection ratio of AlSiCu to carbon was about 9, and a selection ratio of AlSiCu to $SiO_2$ was about 8.5.

Under these conditions, when an amount of residue produced on a wafer was observed, any residue could not be detected when the carbon film pattern 14a was used as a mask. In contrast to this, when the $SiO_2$ film pattern 14' was used as a mask, a small amount of residue was detected. The difference between the amounts of residue was caused by the following reason. That is, when the $SiO_2$ mask is used, since oxygen was generated from the mask by ion collision during RIE, an amount of residual oxygen is increased, and Al oxide is produced.

When the shape of the AlSiCu thin film 13 etched as described above was observed, a pattern having substantially vertical side walls could be obtained at a line-and-space (L/S) portion of the pattern when the carbon film pattern 14a was a mask as shown in FIG. 7A. However, when the $SiO_2$ film pattern 14' or the resist pattern 15 was used as a mask as shown in FIG. 7B, it was found that one end (having no L/S pattern) of the pattern ends of the L/S pattern had a large tapered shape. When the carbon film pattern 14a was used as a mask, a phenomenon in which the pattern was extremely asymmetric was not observed.

It is supposed that this is based on the following phenomenon. That is, electrons and ions accelerated by an electric field generated in an ion sheath are incident on the mask pattern during etching. When an object to be etched (mask material) is an insulator, charges are accumulated in the insulator by the incident ions or electrons (charge-up). In contrast to this, when the object to be etched is made of an conductive material, charge-up does not occur.

Therefore, in the above explanation, charge-up occurs in the side wall of the $SiO_2$ film pattern 14' or the resist pattern 15a serving as an insulator by charged particles incident on the mask pattern from a diagonal direction, thereby accumulating charges. Since the same amounts of charges are accumulated in the both sides of the pattern, ions are symmetrically curved at the central portion of the L/S pattern, and etching is vertically performed. However, at the ends of the L/S pattern, since the $SiO_2$ film pattern 14' is located at only one end of the L/S pattern, ions are curved by a charged-up $SiO_2$ mask, and an asymmetric pattern is formed.

On the other hand, when the carbon film pattern 14a is used as an etching mask, the carbon film has a resistivity as low a $10^{-4}$ cm and is conductive material. Therefore, since the mask is not charged up, as shown in FIG. 7A, an etching shape is symmetric and vertical even at the ends of the L/S pattern.

In dry etching, when a bias voltage (cathode drop voltage) generated by a plasma potential and an electrode on which a sample was mounted was changed, and AlSiCu thin films were etched using the $SiO_2$ film and the carbon film as etching patterns, respectively, the shapes of the patterns at the ends of the L/S pattern were evaluated. As described above, the pattern shapes become a tapered shape when an influence of a charging effect is large, and the pattern has vertical side walls when the influence of the charging effect is small.

Figure 8:
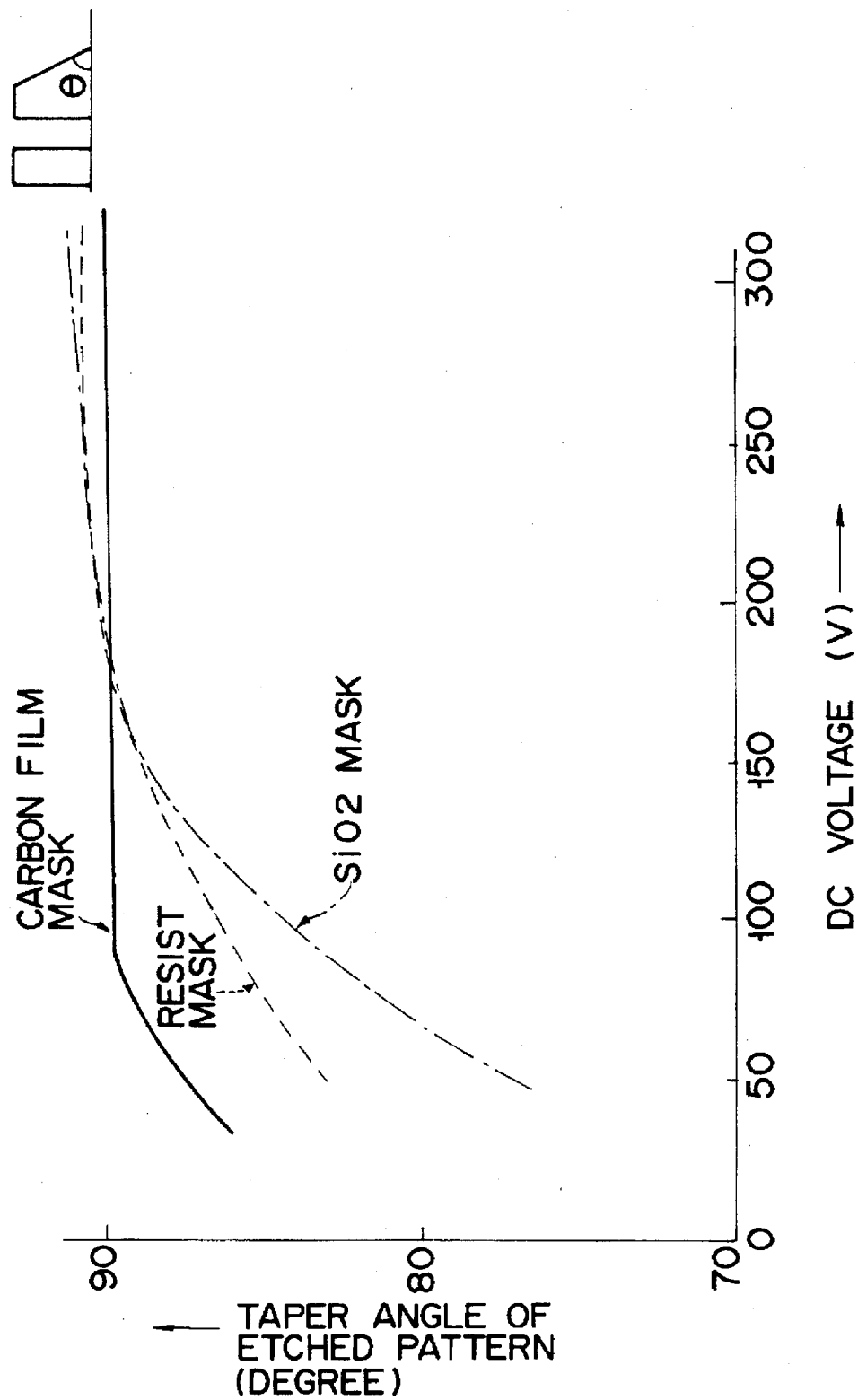
FIG. 8 is a graph showing a relationship between a DC voltage and a taper angle of an etched pattern.

The shape of an AlSiCu thin film etched such that a bias voltage was changed was observed with an SEM, and taper angles were measured at the ends of an L/S pattern. The resultant values obtained by the above measurement are shown in FIG. 8. Referring to FIG. 8, when the carbon film is used as a mask, since the mask pattern is not charged up, etching can be performed with high accuracy even when the bias voltage is set to be low.

Figure 9:
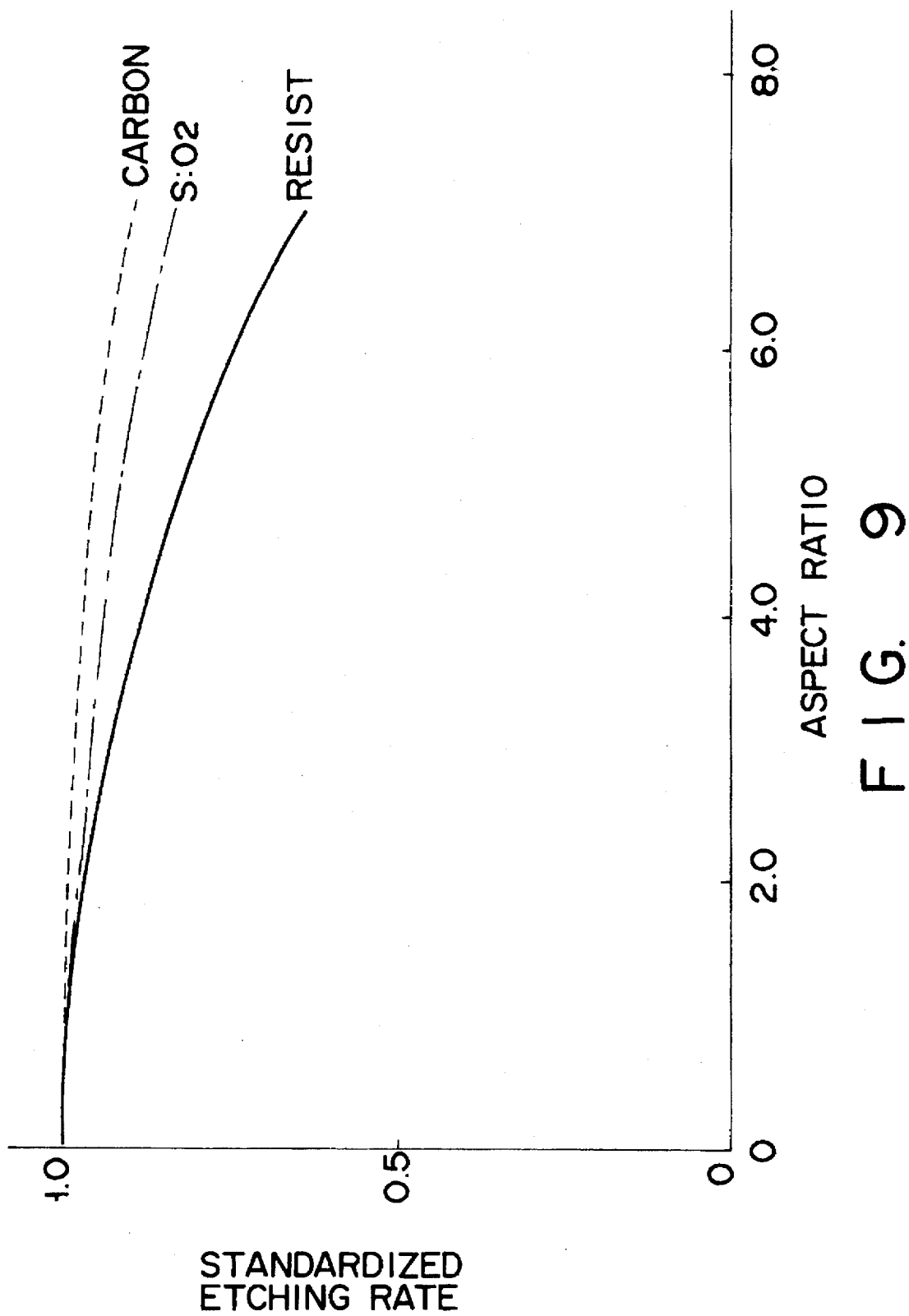
FIG. 9 is a graph showing a relationship between an aspect ratio and an etching rate.

As shown in FIG. 9, etching rate dependency (microloading effect) of an opening size (aspect ratio) on a resist film thickness was examined. At this time, when a mask constituted by a carbon film pattern was used, highly accurate etching could be performed with small microloading effect.

Figure 6H:
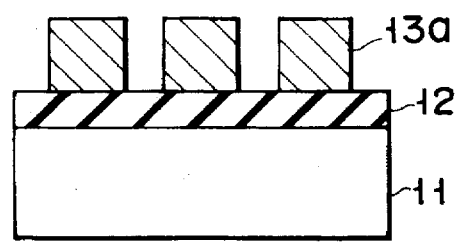

As shown in FIG. 6H, the carbon film pattern 14a and the $SiO_2$ film pattern 14' were removed. The removal of the carbon film pattern 14a was performed by a conventional $O_2$ plasma etching apparatus as in Example 1. As a result, the carbon film pattern 14a could be easily removed.

In contrast to this, the $SiO_2$ film pattern 14' was not etched at all by the $O_2$ plasma etching. For this reason, in order to remove the $SiO_2$ film pattern 14', when etching was performed by a down-flow apparatus using a gas mixture of $CF_4$ gas and $O_2$ gas, the $SiO_2$ film pattern 14' could be removed. However, when the SiO2 film pattern 14' was removed by the down-flow apparatus, a large amount of corrosion was produced on the AlSiCu thin film 13. In addition, since the $SiO_2$ film serving as an underlayer was etched at the same time, the AlSiCu pattern was undercut.

When the carbon film 14 was used as a mask, after the carbon film was removed by $O_2$ plasma etching, any corrosion could not be detected on the AlSiCu thin film 13. Although the removal of the $SiO_2$ film 14' was performed using various wet etching solutions such as an HF solution, the $SiO_2$ film 14' could not be removed without damage to the AlSiCu thin film 13 and the underlying $SiO_2$ film 12.

The corrosion of the AlSiCu thin films formed by the processes described in Examples 1 and 2 were valued. A sample used in this case was arranged as follows. That is, an $SiO_2$ film was formed on an Si substrate, and a Ti thin film (film thickness: 20 nm), a TiN thin film (film thickness: 70 nm), and an AlSiCu (Si concentration: 1 wt %; Cu concentration: 0.5 wt %) thin film were sequentially deposited on the surface of the $SiO_2$ film. In addition, as shown in FIG. 1B, the surface of the AlSiCu thin film was modified by the $O_2$ plasma process.

The AlSiCu/TiN/Ti/$SiO_2$ multi-layered thin film structures formed by the above process were formed by the steps shown in FIGS. 1B to 1G in Example 1 and the steps shown in FIGS. 6B to 6H, respectively.

In this process, the TiN/Ti thin films were etched under the same condition as that of etching of the AlSiCu film after the AlSiCu film was etched. When the shapes of the etched samples were observed with an SEM, it was confirmed that the AlSiCu/TiN/Ti structures were substantially vertically etched in both processes described in Examples 1 and 2.

Figure 10:
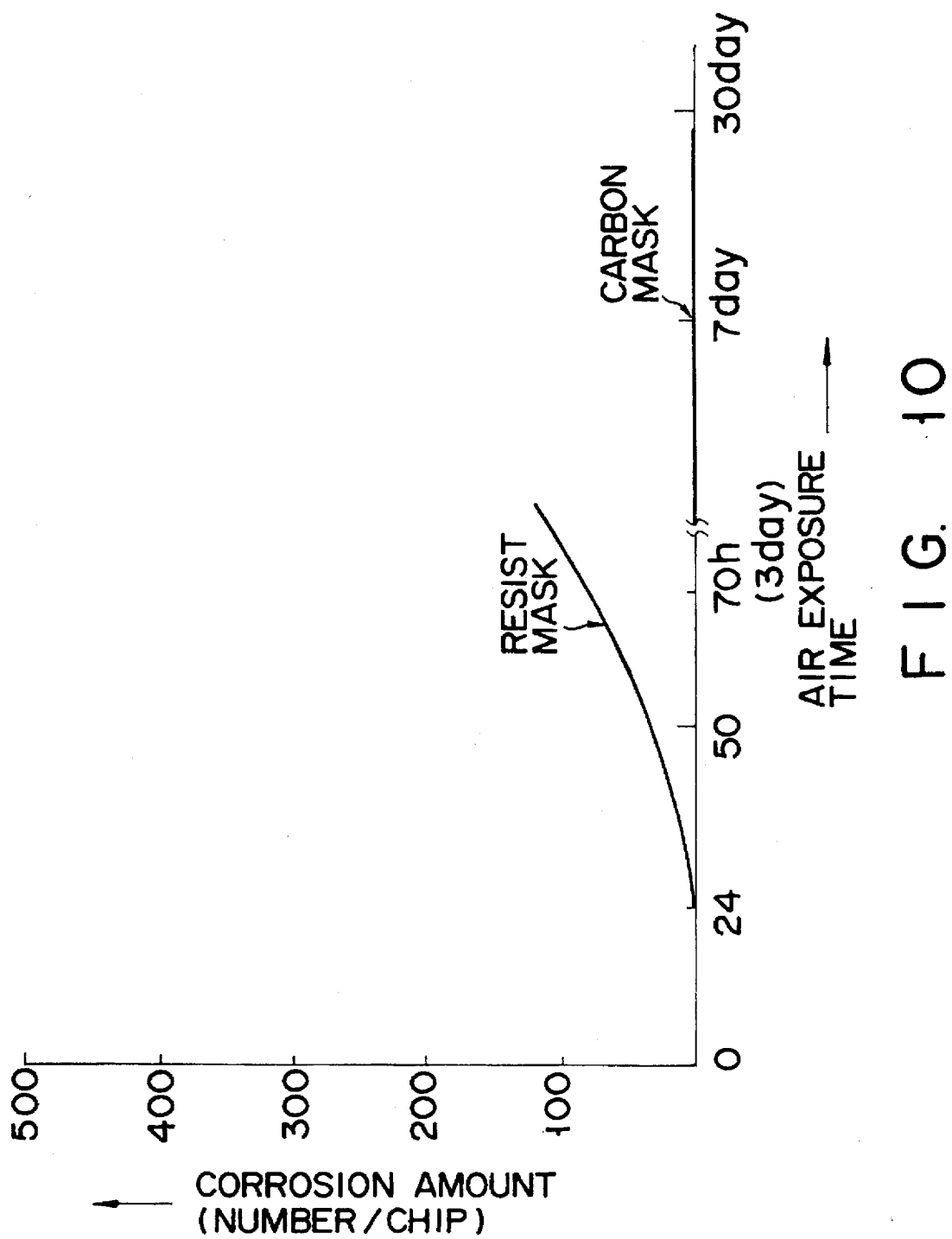
FIG. 10 is a graph showing a relationship between an air exposure time and a corrosion amount.

After these samples were etched, the substrates of the samples were annealed in an $N_2$ atmosphere at a temperature of 200° C. for 2 minutes, and the samples were left to stand in the air. In this state, corrosion of the samples were evaluated with an optical microscope. The resultant values obtained by evaluating amounts of corrosion produced in chips are shown in FIG. 10. Referring to FIG. 10, when etching was performed using the resist as a mask, corrosion was detected after the sample was left to stand in the air for 24 hours. In contrast to this, when etching was performed using the carbon film as a mask, any corrosion was not detected after the sample was left to stand in the air for a week. It is found that corrosion is not produced after the sample is left to stand in the air for a long time since the carbon film contains almost no impurity such as halogen (as described above, the amount of impurity is smaller than that corresponding to the detection sensibility of an SIMS analysis).

In order to examine the cause of this, an etched wafer was dipped into distilled water, and the wafer was analyzed by ion chromatography. In this case, as shown in FIG. 11, Cl, and F were detected as impurities. Especially, amounts of Cl and F obtained when the resist was used as a mask are larger than that obtained when the carbon film was used as a mask.

That is, when the wafer is left to stand in the air, $F^-$ or $Cl^-$ is is produced by impurities present in the AlSiCu film and the surface thereof and moisture in the air. Water containing $F^-$ or $Cl^-$ becomes an electrolyte, and the following reactions easily occur.

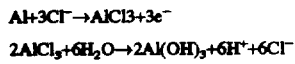

Once these reactions occur, corrosion of the AlSiCu film progresses by Cl ions produced by these reactions.

EXAMPLE 3

As Example 3 of the present invention, a method of controlling an etching pattern shape in etching of an AlSiCu film using a carbon film mask will be described below.

According to the steps in FIGS. 6A to 6F of Example 2, a carbon film pattern 14a was formed on an AlSiCu film 13. As shown in FIG. 6G, the AlSiCu film 13 was selectively etched using the carbon film pattern as a mask. In this etching of the AlSiCu film 13, a dry etching apparatus having a magnetron was used.

As etching conditions, a substrate temperature was kept at 50° C., a gas mixture (flow rate: 100 SCCM) of $Cl_2$ gas and $BCl_3$ or a gas mixture (flow rate: 100 SCCM) of $Cl_2$ gas and $BBr_3$ was used as an etching gas, and CO gas (flow rate: 0 to 100 SCCM) was used as a deposition gas.

Etching was performed at an etching pressure of 2.0 Pa and an RF voltage density of 0.8 W/cm$^2$.

Figure 12:
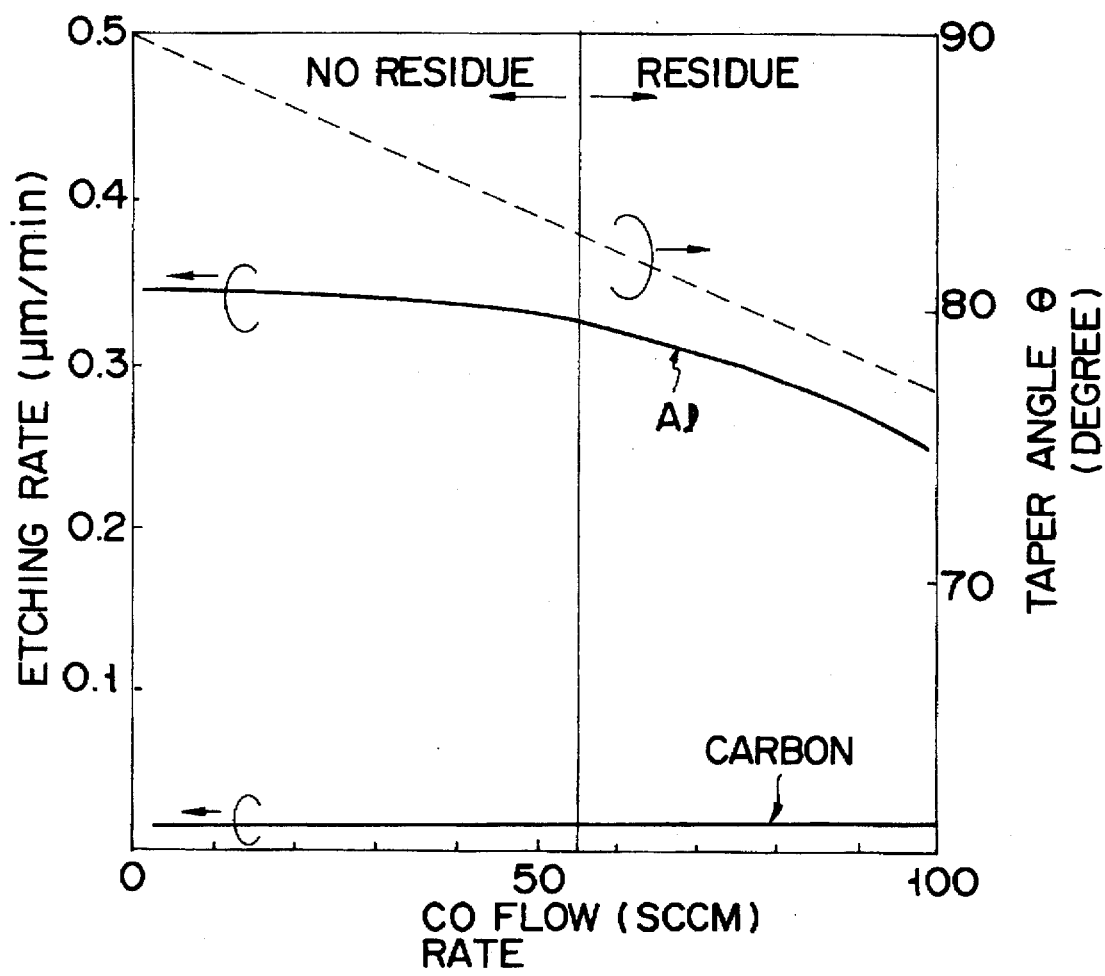
FIG. 12 is a graph showing resultant values obtained by measuring an etching rate and an etched shape when a flow rate of CO gas serving as a deposition gas is changed.

FIG. 12 shows resultant values obtained by measuring the etching rate and shape of an etching film when the flow rate of the CO gas serving as the deposition gas is changed. At this time, a pressure was kept at 2.0 Pa, an RF power was set to 0.8 W/cm$^2$, a gas mixture of $Cl_2$ gas and $BCl_3$ gas was used as an etching gas, and a substrate temperature was set at 50° C.

As the CO flow rate was increased, the taper angle of the AlSiCu film pattern 13a was changed from 90° to 77°. As a result, it was found that the pattern shape could be controlled by the CO flow rate. Although the etching rate of carbon was constant regardless of the CO flow rate, the etching rate of the AlSiCu film 13 was slightly decreased as the CO flow rate was increased.

However, an etching selection ratio of AlSiCu to carbon was 10 even when the CO flow rate was set to 100 SCCM. Therefore, it was found to obtain a high selection ratio.

Any residue was not detected with an optical microscope after the etching while the CO flow rate was increased up to 50%. However, when the CO flow rate exceeded 50%, a residue was detected.

Therefore, it was effective that the CO flow rate was 50 SCCM or less of the flow rate of the etching gas.

An etching pressure was changed from 1.0 Pa to 10 Pa, a high-frequency power density and a substrate temperature were kept at 0.8 W/cm$^2$ and 50° C., respectively, and a gas mixture of $Cl_2$ gas and $BCl_3$ gas to which CO gas was added at a rate of about 30 SCCM was used as an etching gas. Under these conditions, etching was performed.

Figure 13:
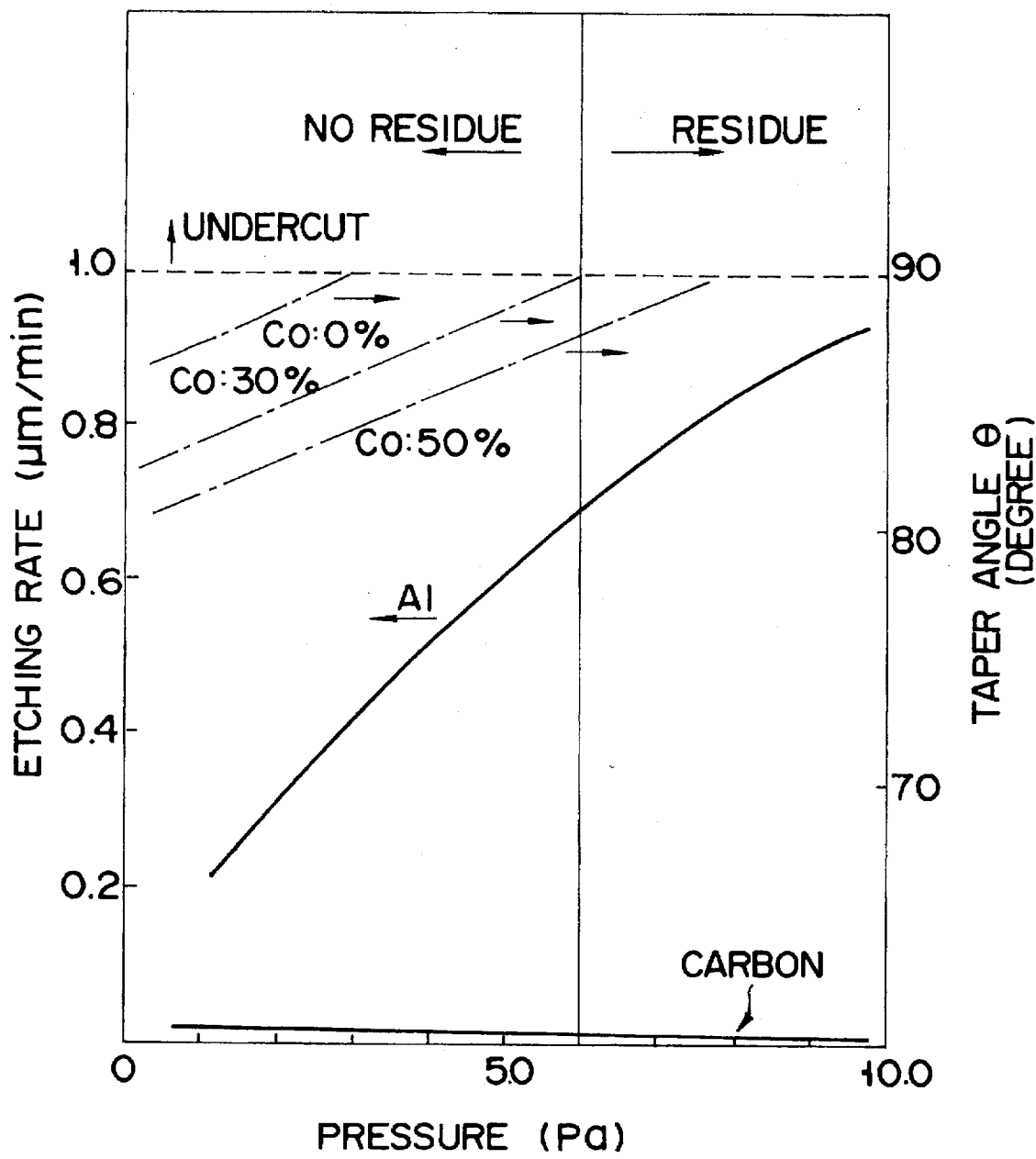
FIG. 13 is a graph showing resultant values obtained by measuring etching rates of an AlSiCu film and a carbon film and a taper angle of an AlSiCu film pattern when a pressure is changed.

FIG. 13 shows resultant values obtained by measuring the etching rates of AlSiCu and carbon when the pressure is changed, and the taper angle of the AlSiCu film pattern 13a when the flow rate of CO was set to 0%, 30% and 50% based on the flow rate of $Cl_2+BCl_3$.

As the pressure was increased, although the etching rate of AlSiCu was increased, the etching rate of carbon was decreased. Therefore, it was found that a selection ratio could be increased by increasing the pressure. However, it was found to produce some residue after the etching when the pressure was increased to 6.0 Pa or more. When any CO gas was not added, side etching occurred in the AlSiCu film pattern 13a etched at a pressure of 3.0 Pa or more, and the AlSiCu film pattern 13a has a reverse tapered shape. For this reason, CO gas was added to the etching gas at a rate of 0 to 50%, and etching was performed. As a result, it was found that side etching was performed at a CO flow rate of less than 50% and a pressure of 7 Pa or less so as to obtain a pattern having a normal tapered shape.

In steps of FIGS. 6A to 6H in Example 2, a gas mixture of $Cl_2$ gas and HBr gas ($Cl_2$/HBr=50/50 SCCM) was used as an etching gas, an etching gas pressure was changed from 1.0 Pa to 10 Pa, and a high-frequency power density and a substrate temperature were kept at 2.5 w/cm² and 70° C., respectively. Under these conditions, etching was performed.

It was found that at an etching pressure of 6 Pa, the AlSiCu film 13 was etched at a rate of 700 Å/min, the carbon film 14 was etched at a rate of 700 Å/min, and the AlSiCu film 13 could be etched without any residue to have a tapered shape.

When the etching pressure, however, was set to 7 Pa or more, the surface of the etched AlSiCu film pattern 13a was roughed, and highly accurate etching could not be performed. For this reason, under these conditions, CO gas was added at a rate of about 30% of the total gas flow rate of $Cl_2$+HBr, and etching was performed. As a result, the etching pattern shape was a tapered shape having a taper angle of 85°. When the state of the side wall of the etched pattern was observed with an SEM, a rough portion was not detected on the surface, and a smoothed surface could be obtained. At the above CO flow rate, any residue was not detected.

After the etching was performed, the AlSiCu film pattern 13a was observed with an SEM. As shown in FIG. 6G, it was found that a 0.4-µm L/S (line and space) pattern was preferably etched. In addition, at an end of the L/S pattern, a taper angle was measured. As a result, it was found that the taper angles were not changed at the center and ends of the L/S pattern and that a symmetric etching shape could be obtained.

Finally, as shown in FIG. 6H, the carbon film pattern 14a was removed. Plasma ashing was performed to the carbon film pattern 14a using a conventional barrel type plasma etching apparatus as an etching apparatus and using $O_2$ gas as an etching gas. As a result, it was confirmed that the carbon film pattern 14a could be easily removed.

After the carbon film pattern 14a was removed, the AlSiCu pattern was evaluated with an SEM. As a result, it was understood that the 0.4 µm/0.4-µm line/space AlSiCu film pattern 13a having a tapered shape could be preferably formed even when a gas mixture of $Cl_2$ gas and $BCl_3$ gas or a gas mixture of $Cl_2$ gas and HBr gas was used.

After a thin film having a multi-layered structure of AlSiCu/TiN/Ti/SiO$_2$ and serving as an etching sample was etched under the above conditions in which CO gas was added to the etching gas, the sample from which a carbon film pattern was removed was left to stand in the air, and the state of corrosion was observed with an optical microscope. As a result, even after the sample was left to stand in the air for one week, any corrosion was not detected.

EXAMPLE 4

As Example 4 of the present invention, a method of forming an n⁺-type Si film pattern will be described below with reference to FIGS. 14A to 14G. FIGS. 14A to 14G are sectional views showing the steps in forming an n⁺-type Si film pattern according to the method of the present invention.

Figure 14A:
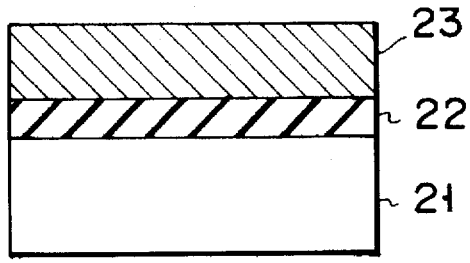
FIGS. 14A to 14G are sectional views showing the steps in forming an Si film pattern according to Example 4 of the present invention.

As shown in FIG. 14A, an SiO$_2$ film 22 was formed on an Si substrate 21 to have a thickness of 100 Å, and a polysilicon film 23 having a thickness of 3,000 Å was deposited on the SiO$_2$ film by a CVD method. Phosphorus was diffused in the polysilicon film 23 to form an n⁺-type polysilicon film 23.

Figure 14B:
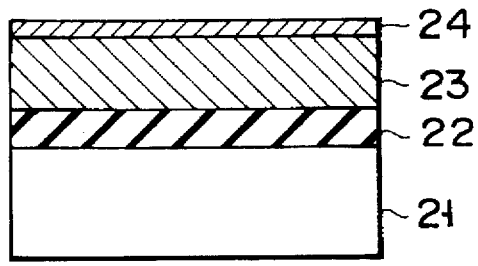

As shown in FIG. 14B, a carbon film (thickness: 1,500 Å) 24 was formed by a sputtering method.

Figure 14C:
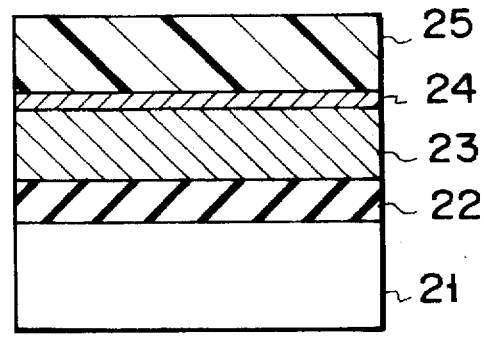
Figure 14D:
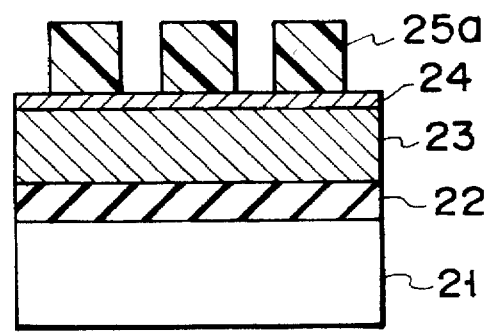

As shown in FIG. 14C, a photoresist 25 (thickness: 1.3 µm) was coated on the carbon film 24, and the photoresist 25 was exposed by a conventional lithographic technique. Subsequently, as shown in FIG. 14D, the resist 25 was developed to form a resist pattern 25a. In the step shown in FIG. 14D, although an alkaline solution was used as a developer, a problem such as elution or peeling of the carbon film 24 was not posed.

Figure 14E:
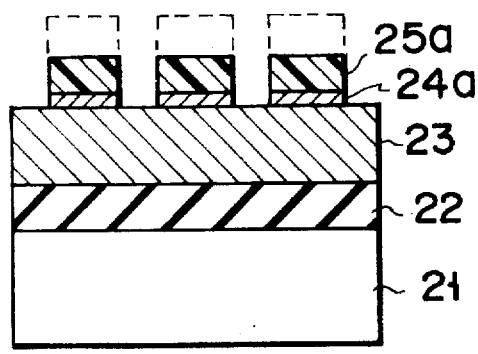
Figure 14F:
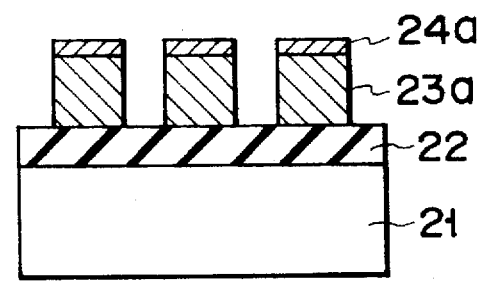

As shown in FIGS. 14E and 14F, the carbon film 24 was selectively etched by RIE using the resist pattern 25a as a mask and using the above dry etching apparatus to form a carbon film pattern 24a. The n⁺-type Si film 23 was selectively etched using the carbon film pattern 24a as a mask to form an n⁺-type Si film pattern 23a.

In the etching of the carbon film pattern 24, $O_2$ gas was used as an etching gas, and a substrate temperature was decreased as described in Example 1. Therefore, the carbon film 24 could be patterned to have vertical side walls.

In the etching of the n⁺-type Si film 23, the above dry etching apparatus having a magnetron was used. As etching conditions, a pressure was kept at 11 Pa, a total gas flow rate was set to be constant, i.e., 100 SCCM, $Cl_2$ gas and HBr gas were used, and a high-frequency voltage was changed.

FIGS. 15 and 16 show a relationship between an etching rate and a DC voltage (Vdc) applied across a plasma and a substrate when $Cl_2$ gas and HBr gas are used and etching is performed such that a high-frequency power density is changed.

The following could be found by the results shown in FIGS. 15 and 16. That is, although the etching rates of the SiO$_2$ film 22, the n⁺-type Si film 23, and the carbon film 24 were increased in proportion to an increase in Vdc, an Si/SiO$_2$ selection ratio and an Si/carbon selection ratio were decreased. In addition, it was found that the carbon film 24 was rarely etched until the DC voltage was close to 100V and that the carbon film 24 was etched at the Vdc of 100V or more. Therefore, it was found that Si could be etched at a high selection ratio of Si to the carbon mask when the DC voltage Vdc was kept at 100V or less.

The substrate temperature was decreased to −30° C. at the Vdc of 100V, and the n⁺-type Si film 23 was etched using $Cl_2$ gas and using the carbon film pattern as a mask. In this case, the n⁺-type Si film 23 was etched at a rate of about 240 nm/min, and the carbon film 24 was etched at a rate of about 2 nm/min, and a selection ratio of the n⁺-type Si film 23 and the carbon film 24 was about 120. At this time, the SiO$_2$ was etched at a rate of about 12 nm/min, and a selection ration of the n⁺-type Si film 23 to the SiO$_2$ film 22 was about 20. The shape of the etched n⁺-type Si film 23 was valued with an SEM. As a result, it was found that the etched pattern had vertical side walls.

On the other hand, when the n⁺-type Si film 23 was etched using a resist pattern as a mask under the above conditions, the resist film 23 was etched at a rate of about 25 nm/min. Therefore, a selection ratio of the n⁺-type Si film 23 to the resist film 23 was about 3. However, at this time, the SiO$_2$ film 22 was etched at a rate of about 20 nm/min, and a selection ratio of the n⁺-type Si film 23 to the SiO$_2$ film 22 was about 12. As a result, it was found that the selection ratio of the n⁺-type Si film 23 to the SiO$_2$ film 22 could be increased by using the carbon film pattern 24a.

In the next step, the n⁺-Si film 23 was etched using the patterned carbon film 24 as a mask at a substrate temperature of 60° C. A HBr gas was used in this etching, and Vdc was set at 100V. The etching rates of the n⁺-Si film 23 and the carbon film 24 were found to be about 100 nm/min and about 1 nm/sec, respectively. In other words, the selectivity ratio of the n⁺-Si film to the carbon film was about 100. In this case, the etching rate of the $SiO_2$ film 22 was about 4 nm/min and, thus, the etching selectivity ratio of the $n^+$-Si film 23 to the $SiO_2$ film 22 was about 25. When observed by SEM, the $n^+$-Si film 23 was found to have been etched substantially vertically.

That is, when the carbon film pattern 24a was an etching mask, the $n^+$-type Si film 23 could be etched at a high selection ratio. In addition, an $n^+$-type $Si/SiO_2$ selection ratio could be increased.

Figure 14G:
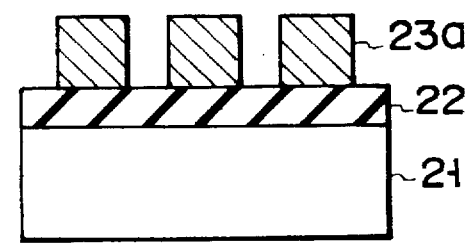

Finally, as shown in FIG. 14G, when the carbon film pattern 24a was removed using conventional $O_2$ plasma ashing, the carbon film pattern 24a could be removed without any residue.

Thus formed structure can be applied to a polycrystalline wiring and MOS capacitor.

In the above examples, although a magnetron reactive ion etching apparatus having parallel plate electrodes is used as an etching apparatus, a reactive ion etching apparatus using ECR discharging obtained by applying a microwave in which high density plasma can be generated, or a reactive ion etching apparatus in which a voltage is applied to a substrate to be etched in a discharging plasma produced by applying a microwave or an electron beam or an electron beam is irradiated (for example, J. Vac. Sci. Technol. B5 (1), Jan/Feb 1987, p. 366 to 368), may be used as the etching apparatus.

Furthermore, as the etching apparatus, a reactive ion etching apparatus in which a discharging plasma is produced by applying an RF of 27 MHz or more, e.g. 27.12 MHz to parallel plate electrodes and mounting a target substrate on a cathode, or a reactive ion etching apparatus (for example, J. Vac. Sci. Technol. B 912, Var/Apr 1991, p. 310 to 317) in which a induction-coupled RF is applied to the target substrate may be used.

In the above examples, $BCl_3$, $Cl_2$, HBr and $BBr_3$ are used as an etching gas solely or in combination, in addition to these gases, a Br containing gas such as $Br_2$ gas or a Cl containing gas such as HCl gas may be used as an etching gas.

In the above examples, etching of an AlSiCu or Si film is exemplified. It is, however, possible to etch Al, AlSi, AlCu, $SiO_2$, a refractory metal (e.g., tungsten or molybdenum), or a refractory metal silicide.

As described above, according to the present invention, in a method in which a carbon film is used as a mask pattern used in dry etching, a selection ratio of an etching mask to a material to be etched can be increased during dry etching. In addition, since a conductive thin film is used as a mask material, the mask pattern is not charged up even when charged particles are radiated on it. Since a low aspect ratio can be obtained, a microloading effect is decreased. Therefore, highly accurate micropatterning can be performed.

Furthermore, since a carbon film can be formed with high purity, etching products decomposed by colliding particles such as a plasma having high energy with the carbon film do not contain an impurity (e.g., heavy metals, a halogen, or the like) which adversely affects to a device. For the reason, corrosion of metal wiring lines does not occur. An $n^+$-type Si film can be etched at a high selection ratio with respect to an Si film.

Since a carbon film can be selectively easily removed by plasma etching using $O_2$ gas, other materials are not damaged during this removing step.

Therefore, in the steps in manufacturing a semiconductor integrated circuit, a micropattern can be obtained with high accuracy, and highly reliable wiring lines, gate electrodes, or the like can be formed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a carbon film on a layer, wherein said layer is on a substrate, and said layer comprises aluminum;

forming a resist pattern on said carbon film;

etching said carbon film along said resist pattern, with a gas comprising oxygen or an oxygen bearing compound, to form a carbon film pattern; and reactive ion etching said layer along said carbon film pattern, with a plasma of a gas comprising a member selected from the group consisting of chlorine, bromine, a chlorine bearing compound and a bromine bearing compound;

wherein said plasma is produced by a member selected from the group consisting of
      (i) application of an alternating current and a magnetic field,
      (ii) application of microwaves,
      (iii) irradiation by an electron beam,
      (iv) application of a radio frequency of 27 MHz or more, and
      (v) application of an inductively coupled high frequency; and wherein said reactive ion etching is carried out under conditions such that there is a DC voltage across said plasma and said substrate of less than 200V.

2. A method according to claim 1, wherein said carbon film is formed by a method selected from the group consisting of sputtering, vacuum evaporation and chemical vapor deposition.

3. A method according to claim 1, wherein a temperature of said substrate is controlled within a range of $-100°$ C. to $50°$ C.

4. A method according to claim 1, wherein said reactive ion etching step is performed such that a gas comprising chlorine is used as an etching gas.

5. A method according to claim 1, wherein said DC voltage is not less than 30V.

6. A method according to claim 1, wherein the step of etching said carbon film is performed by reactive ion etching using oxygen gas as an etching gas.

7. A method according to claim 1, wherein said substrate comprises a $SiO_2$ film on silicon, and said layer is on said $SiO_2$ film.

8. A method according to claim 1, wherein said layer consists of aluminum or an aluminum alloy.

9. A method according to claim 1, further comprising the step of exposing said layer to a plasma comprising oxygen gas before forming said carbon film.

10. A method according to claim 1, wherein said plasma is produced by a member selected from the group consisting of:

(ii) application of microwaves, (iii) irradiation by an electron beam, and (v) application of an inductively coupled high frequency.

11. A method of manufacturing a semiconductor device, comprising the steps of:

forming a carbon film on a layer, wherein said layer is on a substrate, and said layer comprises silicon;

forming a resist pattern on said carbon film;

etching said carbon film along said resist pattern, with a gas comprising oxygen or an oxygen bearing compound, to form a carbon film pattern; and reactive ion etchings of said layer along said carbon film pattern, with a plasma of a gas comprising a halogen or a halogen bearing compound;

wherein said plasma is produced by a member selected from the group consisting of:

(i) application of an alternating current and a magnetic field, (ii) application of microwaves (iii) irradiation by an electron beam, (iv) application of a radio frequency of 27 MHz or more, and (v) application of an inductively coupled high frequency;

wherein said reactive ion etching is carried out under conditions such that there is a DC voltage across said plasma and said substrate of less than 100V.

12. A method according to claim 11, wherein said reactive ion etching step is performed such that a gas comprising chlorine or bromine is used as an etching gas.

13. A method according to claim 11, wherein said DC voltage is not less than 30V.

14. A method according to claim 11, wherein the step of etching said carbon film is performed by reactive ion etching using oxygen gas as an etching gas.

15. A method according to claim 11, wherein said substrate comprises a $SiO_2$ film on silicon, and said layer is on said $SiO_2$ film.

16. A method according to claim 11, wherein said layer consists essentially of polysilicon.

17. A method according to claim 11, wherein said plasma is produced by a member selected from the group consisting of:

(ii) application of microwaves, (iii) irradiation by an electron beam, and (v) application of an inductively coupled high frequency.

18. A method of manufacturing a semiconductor device, comprising the steps of:

forming a carbon film on a layer, wherein said layer is on a substrate, and said layer comprises aluminum;

forming a resist pattern on said carbon film;

etching said carbon film along said resist pattern, with a gas comprising oxygen or an oxygen bearing compound, to form a carbon film pattern; and reactive ion etching said layer along said carbon film pattern, with a plasma of a gas comprising a member selected from the group consisting of chlorine, bromine, a chlorine bearing compound and a bromine bearing compound;

wherein said reactive ion etching is carried out under conditions such that there is a DC voltage across said plasma and said substrate of less than 200V.

19. A method according to claim 18, wherein said substrate comprises a $SiO_2$ film on silicon, and said layer is on said $SiO_2$ film.

20. A method of manufacturing a semiconductor device, comprising the steps of:

forming a carbon film on a substrate;

forming a resist pattern on said carbon film;

etching said carbon film along said resist pattern, with a gas comprising oxygen or an oxygen bearing compound, to form a carbon film pattern; and reactive ion etching said substrate along said carbon film pattern, with a plasma of a gas comprising a member selected from the group consisting of chlorine, bromine, a chlorine bearing compound and a bromine bearing compound;

wherein said plasma is produced by a member selected from the group consisting of (i) application of an alternating current and a magnetic field (ii) application of microwaves, (iii) irradiation by an electron beam, (iv) application of a radio frequency of 27 MHz or more, and (v) application of an inductively coupled high frequency; and wherein either:

(a) a surface of said substrate comprises aluminum, and said reactive ion etching is carried out under conditions such that there is a DC voltage across said plasma and said substrate of less than 200V; or (b) a surface of said substrate comprises silicon, and said reactive ion etching is carried out under conditions such that there is a DC voltage across said plasma and said substrate of less than 100V.

* * * * *